US012167641B2

(12) United States Patent
Son et al.

(10) Patent No.: US 12,167,641 B2
(45) Date of Patent: Dec. 10, 2024

(54) DISPLAY PANEL DRIVEN BY A THIN FILM TRANSISTOR INCLUDING A SILICON SEMICONDUCTOR AND A THIN FILM TRANSISTOR INCLUDING AN OXIDE SEMICONDUCTOR

(71) Applicant: Samsung Display Co., Ltd., Yongin-Si (KR)

(72) Inventors: Sewan Son, Yongin-si (KR); Moosoon Ko, Yongin-si (KR); Seokje Seong, Yongin-si (KR); Seongjun Lee, Yongin-si (KR); Jeongsoo Lee, Yongin-si (KR); Jiseon Lee, Yongin-si (KR); Changho Yi, Yongin-si (KR); Hyeri Cho, Yongin-si (KR)

(73) Assignee: Samsung Display Co., Ltd., Yongin-Si (KR)

(*) Notice: Subject to any disclaimer, the term of this patent is extended or adjusted under 35 U.S.C. 154(b) by 0 days.

(21) Appl. No.: 18/096,623

(22) Filed: Jan. 13, 2023

(65) Prior Publication Data
US 2023/0157074 A1 May 18, 2023

Related U.S. Application Data

(63) Continuation of application No. 17/002,696, filed on Aug. 25, 2020, now Pat. No. 11,563,069.

(30) Foreign Application Priority Data

Feb. 24, 2020 (KR) .................. 10-2020-0022373

(51) Int. Cl.
*H10K 59/12* (2023.01)
*H10K 59/121* (2023.01)
(Continued)

(52) U.S. Cl.
CPC ....... *H10K 59/1213* (2023.02); *H10K 59/126* (2023.02); *H10K 59/131* (2023.02);
(Continued)

(58) Field of Classification Search
CPC ............ H10K 59/1213; H10K 59/131; H10K 59/126; H10K 59/1216; H01L 27/1225; H01L 27/1251
(Continued)

(56) References Cited

U.S. PATENT DOCUMENTS 6,156,472 A  12/2000 Segi et al.
9,257,563 B2  2/2016 Ahn et al.
(Continued)

FOREIGN PATENT DOCUMENTS

CN  101630682 A  1/2010
CN  106611775 A  5/2017
(Continued)

*Primary Examiner* — Phuc T Dang
(74) *Attorney, Agent, or Firm* — Innovation Counsel LLP

(57) ABSTRACT

A display panel includes a substrate, a first thin film transistor including a first semiconductor layer and a first gate electrode, a data line extending in a first direction, a scan line extending in a second direction, a second thin film transistor electrically connected to the data line and including a second semiconductor layer and a second gate electrode, a third thin film transistor including a third semiconductor layer and a first upper gate electrode arranged on the third semiconductor layer, a node connection line electrically connecting the first thin film transistor and the third thin film transistor, and a shield line located between the data line and the node connection line in a plan view and including the same material as the first upper gate electrode of the third thin film transistor. The first semiconductor layer includes a silicon semiconductor, and the third semiconductor layer includes an oxide semiconductor.

15 Claims, 13 Drawing Sheets

(51) Int. Cl.
*H10K 59/126* (2023.01)
*H10K 59/131* (2023.01)
*G09G 3/3258* (2016.01)
*H01L 27/12* (2006.01)
*H10K 59/124* (2023.01)

(52) U.S. Cl.
CPC ... *G09G 3/3258* (2013.01); *G09G 2300/0842* (2013.01); *H01L 27/1225* (2013.01); *H01L 27/1251* (2013.01); *H10K 59/1216* (2023.02); *H10K 59/124* (2023.02)

(58) Field of Classification Search
USPC .......................................................... 257/72
See application file for complete search history.

(56) References Cited

U.S. PATENT DOCUMENTS

| | | | |
|---|---|---|---|
| 10,074,710 B2 | 9/2018 | Enisuno et al. | |
| 10,263,060 B2 | 4/2019 | Noh et al. | |
| 2006/0170634 A1 | 8/2006 | Kwalk et al. | |
| 2010/0006853 A1 | 1/2010 | Yamamoto et al. | |
| 2010/0270678 A1* | 10/2010 | Ikeda | G09G 3/3233 |
| | | | 257/773 |
| 2014/0239270 A1 | 8/2014 | Ko et al. | |
| 2017/0110528 A1 | 4/2017 | Kim et al. | |
| 2017/0117343 A1 | 4/2017 | Oh et al. | |
| 2017/0330927 A1* | 11/2017 | Lee | H10K 59/1213 |
| 2017/0365647 A1* | 12/2017 | Choi | G09G 3/3258 |
| 2018/0088409 A1* | 3/2018 | Lee | H10K 71/50 |
| 2019/0035859 A1 | 1/2019 | Kang et al. | |
| 2019/0131370 A1 | 5/2019 | Heo | |
| 2019/0198806 A1* | 6/2019 | Im | H10K 59/1213 |

FOREIGN PATENT DOCUMENTS

| | | | | |
|---|---|---|---|---|
| CN | 108962956 A | | 12/2018 | |
| CN | 109309109 A | | 2/2019 | |
| EP | 3537480 A1 | * | 9/2019 | ........... G09G 3/3225 |
| JP | 3566516 B2 | | 9/2004 | |
| KR | 2010058746 A | * | 6/2010 | ......... H10K 59/1213 |
| KR | 20150062692 A | * | 6/2015 | ....... H01L 29/78698 |
| KR | 10-2016-0002584 A | | 1/2016 | |
| KR | 10-2018-0012442 A | | 2/2018 | |
| KR | 10-2018-0026602 A | | 3/2018 | |

\* cited by examiner

DISPLAY PANEL DRIVEN BY A THIN FILM TRANSISTOR INCLUDING A SILICON SEMICONDUCTOR AND A THIN FILM TRANSISTOR INCLUDING AN OXIDE SEMICONDUCTOR

CROSS-REFERENCE TO RELATED APPLICATION

This application is a continuation of U.S. patent application Ser. No. 17/002,696, filed on Aug. 25, 2020, now U.S. Pat. No. 11,563,069, which claims priority to and the benefit of Korean Patent Application No. 10-2020-0022373, filed on Feb. 24, 2020, in the Korean Intellectual Property Office, the entire disclosures of which are incorporated by reference herein in its entirety.

BACKGROUND

1. Field

The present disclosure relates to a display panel, and more particularly, to a display panel driven by a thin film transistor including a silicon semiconductor and a thin film transistor including an oxide semiconductor.

2. Description of Related Art

Display apparatuses visually display data. A display apparatus may include a display area and a peripheral area. The display area may include a plurality of pixels and scan lines and data lines that are insulated from each other. The display area may further include a pixel circuit including one or more thin film transistors and a storage capacitor corresponding to each of the pixels. The peripheral area may include various signal lines configured to transmit electrical signals to the pixel circuit of the display area, a scan driver, a data driver, a controller, and the like.

Display apparatuses have been used for various applications. As display apparatuses become thinner and lighter, their range of use and applications have widened. Accordingly, the design of pixel circuits of highly integrated display apparatuses for providing high-quality images has been diversified.

SUMMARY

One or more embodiments of the present disclosure include a display panel having high resolution and capable of providing high-quality images. The display panel may be driven by a thin film transistor including a silicon semiconductor and a thin film transistor including an oxide semiconductor. However, these embodiments are merely examples, and the scope of the present disclosure is not limited thereto.

Additional aspects of the present disclosure will be set forth in part in the following description and, in part, will be apparent from the description, or may be learned by practice of the embodiments disclosed herein.

According to one embodiment, a display panel includes a substrate, a first thin film transistor arranged on the substrate and including a first semiconductor layer and a first gate electrode, a data line arranged on the substrate and extending in a first direction, a scan line arranged on the substrate and extending in a second direction intersecting the first direction, a second thin film transistor electrically connected to the data line and including a second semiconductor layer and a second gate electrode, a third thin film transistor including a third semiconductor layer and a first upper gate electrode arranged on the third semiconductor layer, a node connection line electrically connecting the first thin film transistor and the third thin film transistor, and a shield line located between the data line and the node connection line in a plan view and including the same material as the first upper gate electrode of the third thin film transistor. The first semiconductor layer includes a silicon semiconductor, and the third semiconductor layer includes an oxide semiconductor.

According to the present embodiments, the display panel may further include a driving voltage line extending in the first direction, and a horizontal driving voltage line extending in the second direction, partially intersecting the driving voltage line, and electrically connected to the driving voltage line, wherein the horizontal driving voltage line and the shield line may be connected to each other in a same layer.

According to the present embodiments, the shield line may extend in the first direction.

According to the present embodiments, the shield line may intersect the scan line in the plan view.

According to the present embodiments, the node connection line may extend in the first direction and may intersect the scan line.

According to the present embodiments, the node connection line may be electrically connected to the third semiconductor layer through a contact hole that is located closer to the first thin film transistor than the scan line in the plan view.

According to the present embodiments, the first upper gate electrode may have an isolated shape and may be electrically connected to the scan line through a contact hole that penetrates through at least one insulating layer located between the first upper gate electrode and the scan line.

According to the present embodiments, the third thin film transistor may further include a first lower gate electrode arranged under the third semiconductor layer and overlapping the first upper gate electrode, and the first lower gate electrode and the scan line may be connected to each other in a same layer.

According to the present embodiments, the first lower gate electrode and the first upper gate electrode may include different materials.

According to the present embodiments, the display panel may further include a fourth thin film transistor including a fourth semiconductor layer and a fourth gate electrode, wherein the fourth semiconductor layer includes a second oxide semiconductor, wherein the fourth gate electrode may include a second lower gate electrode arranged between the fourth semiconductor layer and the substrate, and a second upper gate electrode arranged on the fourth semiconductor layer, and wherein the second upper gate electrode may be electrically connected to the second lower gate electrode through a second contact hole that penetrates through at least one insulating layer located between the second upper gate electrode and the second lower gate electrode.

According to one or more embodiments, a display panel includes a substrate, a first thin film transistor arranged on the substrate and including a first semiconductor layer and a first gate electrode, a data line arranged on the substrate and extending in a first direction, a scan line arranged on the substrate and extending in a second direction that is different from the first direction, a second thin film transistor electrically connected to the data line and the scan line and including a second semiconductor layer and a second gate electrode, and a third thin film transistor including a third semiconductor layer including a material that is different from a first material included in the first semiconductor layer and a first upper gate electrode arranged on the third semiconductor layer, wherein the first upper gate electrode has an isolated shape and is connected to the scan line through a contact hole that penetrates through at least one insulating layer located between the first upper gate electrode and the scan line.

According to the present embodiments, the scan line may be connected to a first lower gate electrode of the third thin film transistor that is located opposite to the first upper gate electrode with the third semiconductor layer located therebetween.

According to the present embodiments, the display panel may further include a node connection line extending in the first direction and electrically connecting the first thin film transistor and the third thin film transistor.

According to the present embodiments, the node connection line may be electrically connected to the third semiconductor layer through a contact hole that is located closer to the first thin film transistor than the scan line in a plan view.

According to the present embodiments, the display panel may further include a driving voltage line extending in the first direction and a shield line electrically connected to the driving voltage line and located between the data line and the node connection line.

According to the present embodiments, at least a first portion of the shield line and at least a second portion of the driving voltage line may be located between the data line and the first upper gate electrode in a plan view.

According to the present embodiments, the shield line may intersect the scan line.

According to the present embodiments, the display panel may further include a storage capacitor including a first electrode and a second electrode overlapping the first thin film transistor, wherein the scan line may include a same material as the second electrode of the storage capacitor.

According to the present embodiments, the first semiconductor layer may include a silicon semiconductor, and the third semiconductor layer may include an oxide semiconductor.

According to the present embodiments, the display may further include a plurality of insulating layers located between the first semiconductor layer and the third semiconductor layer.

Aspects, features, and advantages other than those described herein will become apparent at least from the following detailed description, the appended claims, and the accompanying drawings.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
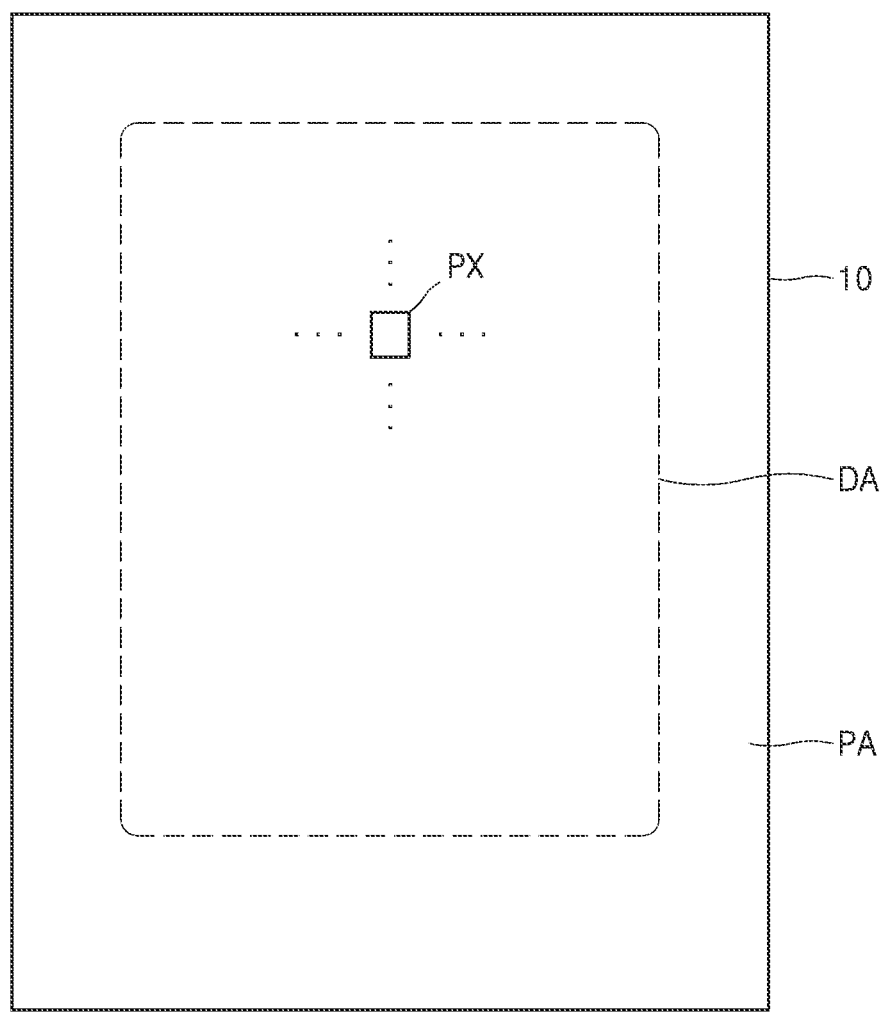
FIG. 1 is a plan view schematically illustrating a display panel according to an embodiment.

Reference will now be made in detail to embodiments, examples of which are illustrated in the accompanying drawings. In this regard, the present embodiments may have different forms and should not be construed as being limited to the descriptions set forth herein. Accordingly, the embodiments are merely examples as described below, by referring to the figures, to explain aspects of the present description. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or any variations thereof.

Hereinafter, embodiments will be described in detail with reference to the accompanying drawings, and in the following description, like reference numerals will denote like elements unless the context clearly indicates otherwise, and redundant descriptions thereof may be omitted.

It will be understood that although terms such as "first" and "second" may be used herein to describe various components, these components should not be limited by these terms, and these terms are only used to distinguish one component from another component.

As used herein, a singular form such as "a," "an," and "the" is intended to include a plural form as well, unless the context clearly indicates otherwise.

It will be understood that terms such as "comprise," "include," and "have" used herein specify a presence of stated features or components, but do not preclude the presence or an addition of one or more other features or components.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of components in the drawings may be exaggerated for convenience of description. In other words, because the sizes and thicknesses of components in the drawings are arbitrarily illustrated for convenience of description, the present disclosure is not limited thereto.

When a certain embodiment may be implemented differently, a particular process order may be performed differently from the described order. For example, two consecutively described processes may be performed substantially at the same time or performed in an order opposite to the described order.

As used herein, "A and/or B" may encompass the case of A, B, or A and B. Also, "at least one of A and B" may encompass the case of A, B, or A and B.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

The x axis, the y axis, and the z axis, or corresponding directions shown with reference to the drawings are not limited to three axes of the rectangular coordinate system and may be interpreted in a broader sense. For example, the x axis, the y axis, and the z axis may be perpendicular to each other or may represent different directions that are not perpendicular to each other.

FIG. 1 is a plan view schematically illustrating a display panel according to an embodiment.

Referring to FIG. 1, a display panel 10 may include a display area DA and a peripheral area PA located outside the display area DA. The display panel 10 may display an image through an array of pixels PX that is two-dimensionally arranged in the display area DA extending in a first direction DR1 and a second direction DR2. The peripheral area PA may correspond to an area that does not provide any image and may entirely or partially surround the display area DA. A driver or the like for providing an electrical signal or power to the pixels PX may be arranged in the peripheral area PA. The peripheral area PA may include a pad to which an electronic device, a printed circuit board, or the like may be electrically connected.

Hereinafter, the display panel 10 will be described as including an organic light emitting diode (OLED) as a display element; however, the display panel 10 of the present disclosure is not limited thereto. In other embodiments, the display panel 10 may be an inorganic light emitting display apparatus (or an inorganic electroluminescence (EL) display apparatus) including an inorganic material such as a micro LED or a quantum dot light emitting display apparatus. For example, an emission layer of the display element included in the display panel 10 may include an organic material, an inorganic material, quantum dots, an organic material and quantum dots, or an inorganic material and quantum dots.

Figure 2:
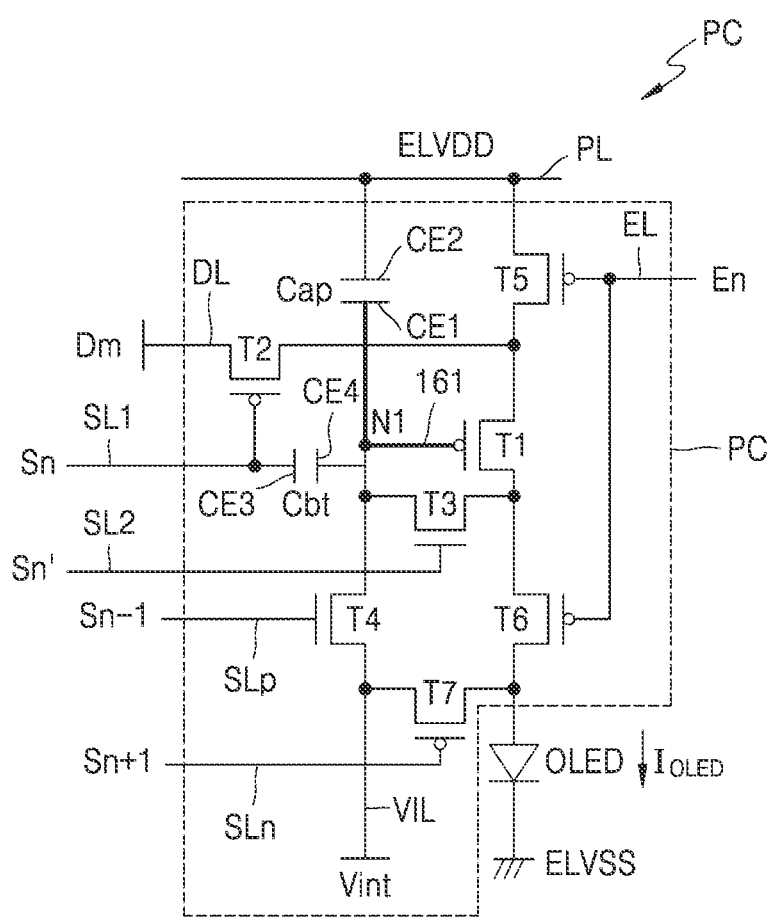
FIG. 2 is an equivalent circuit diagram of a pixel circuit included in a display panel according to an embodiment.

FIG. 2 is an equivalent circuit diagram of a pixel circuit included in a display panel according to an embodiment.

Referring to FIG. 2, an organic light emitting diode OLED may emit light based on a driving voltage received through a pixel circuit PC. The pixel circuit PC may include signal lines SL1, SL2, SLp, SLn, EL, and DL, a plurality of thin film transistors T1, T2, T3, T4, T5, T6, and T7 connected to the signal lines, a storage capacitor Cap, a boost capacitor Cbt, an initialization voltage line VIL, and a driving voltage line PL.

Although FIG. 2 illustrates that each pixel circuit PC includes the signal lines SL1, SL2, SLp, SLn, EL, and DL, the initialization voltage line VIL, and the driving voltage line PL, the present disclosure is not limited thereto. For example, at least one of the signal lines SL1, SL2, SLp, SLn, EL, and DL, the driving voltage line PL, and/or the initialization voltage line VIL may be shared by one or more adjacent pixel circuits PC.

Referring to FIG. 2, the plurality of thin film transistors may include a driving transistor T1, a switching transistor T2, a compensation transistor T3, a first initialization transistor T4, an operation control transistor T5, an emission control transistor T6, and a second initialization transistor T7.

Some of the thin film transistors T1, T2, T3, T4, T5, T6, and T7 may be provided as an n-channel metal-oxide-semiconductor field-effect transistor (MOSFET) (NMOS), and the others may be provided as a p-channel MOSFET (PMOS). For example, as illustrated in FIG. 2, among the thin film transistors T1, T2, T3, T4, T5, T6, and T7, the compensation transistor T3 and the first initialization transistor T4 may be provided as an NMOS, and the other transistors may be provided as a PMOS.

In embodiments, among the thin film transistors T1, T2, T3, T4, T5, T6, and T7, the compensation transistor T3, the first initialization transistor T4, and the second initialization transistor T7 may be provided as an NMOS, and the other transistors may be provided as a PMOS. Alternatively, one of the thin film transistors T1, T2, T3, T4, T5, T6, and T7 may be provided as an NMOS, and the other transistors may be provided as a PMOS. Alternatively, all of the thin film transistors T1, T2, T3, T4, T5, T6, and T7 may all be provided as an NMOS.

The signal lines may include a first scan line SL1 configured to transmit a first scan signal Sn, a second scan line SL2 configured to transmit a second scan signal Sn', a previous scan line SLp configured to transmit a previous signal Sn−1 to the first initialization transistor T4, an emission control line EL configured to transmit an emission control signal En to the operation control transistor T5 and the emission control transistor T6, a next scan line SLn configured to transmit a next scan signal Sn+1 to the second initialization transistor T7, and a data line DL configured to transmit a data signal Dm.

The driving voltage line PL may be configured to transmit a driving voltage ELVDD to the driving transistor T1, and the initialization voltage line VIL may be configured to transmit an initialization voltage Vint for initializing the driving transistor T1 and a pixel electrode of the organic light emitting diode OLED.

A driving gate electrode of the driving transistor T1 may be connected to one electrode of the storage capacitor Cap, a driving source area of the driving transistor T1 may be connected to the driving voltage line PL via the operation control transistor T5, and a driving drain area of the driving transistor T1 may be electrically connected to the pixel electrode of the organic light emitting diode OLED via the emission control transistor T6. The driving transistor T1 may receive the data signal Dm according to a switching operation of the switching transistor T2, and a driving current $I_{OLED}$ flows through the organic light emitting diode OLED.

A switching gate electrode of the switching transistor T2 may be connected to the first scan line SL1, a switching source area of the switching transistor T2 may be connected to the data line DL, and a switching drain area of the switching transistor T2 may be connected to the driving source area of the driving transistor T1 and connected to the driving voltage line PL via the operation control transistor T5. The switching transistor T2 may be turned on according to the first scan signal Sn received through the first scan line SL1 and perform a switching operation of transmitting the data signal Dm transmitted to the data line DL to the driving source area of the driving transistor T1.

A compensation gate electrode of the compensation transistor T3 may be connected to the second scan line SL2. A compensation drain area of the compensation transistor T3 may be connected to the driving drain area of the driving transistor T1 and the pixel electrode of the organic light emitting diode OLED via the emission control transistor T6. A compensation source area of the compensation transistor T3 may be connected to a first electrode CE1 of the storage capacitor Cap and the driving gate electrode of the driving transistor T1 via a node connection line 161. Also, the compensation source area may be connected to a first initialization drain area of the first initialization transistor T4.

The compensation transistor T3 may be turned on according to the second scan signal Sn' received through the second scan line SL2 and electrically connect the driving gate electrode and the driving drain area of the driving transistor T1 to diode-connect the driving transistor T1.

A first initialization gate electrode of the first initialization transistor T4 may be connected to the previous scan line SLp. A first initialization source area of the first initialization transistor T4 may be connected to the initialization voltage line VIL. The first initialization drain area of the first initialization transistor T4 may be connected to the first electrode CE1 of the storage capacitor Cap, the compensation source area of the compensation transistor T3, and the driving gate electrode of the driving transistor T1. The first initialization transistor T4 may be turned on according to the previous scan signal Sn−1 received through the previous scan line SLp and perform an initialization operation of initializing the voltage of the driving gate electrode of the driving transistor T1 by transmitting the initialization voltage Vint to the driving gate electrode of the driving transistor T1 via the initialization voltage line VIL.

An operation control gate electrode of the operation control transistor T5 may be connected to the emission control line EL, an operation control source area of the operation control transistor T5 may be connected to the driving voltage line PL, and an operation control drain area of the operation control transistor T5 may be connected to the driving source area of the driving transistor T1 and the switching drain area of the switching transistor T2.

An emission control gate electrode of the emission control transistor T6 may be connected to the emission control line EL, an emission control source area of the emission control transistor T6 may be connected to the driving drain area of the driving transistor T1 and the compensation drain area of the compensation transistor T3, and an emission control drain area of the emission control transistor T6 may be electrically connected to a second initialization drain area of the second initialization transistor T7 and the pixel electrode of the organic light emitting diode OLED.

The operation control transistor T5 and the emission control transistor T6 may be simultaneously turned on according to the emission control signal En received through the emission control line EL, and the driving voltage ELVDD may be applied to the pixel electrode of the organic light emitting diode OLED to allow the driving current $I_{OLED}$ flow through the organic light emitting diode OLED.

A second initialization gate electrode of the second initialization transistor T7 may be connected to the next scan line SLn, and the second initialization drain area of the second initialization transistor T7 may be connected to the emission control drain area of the emission control transistor T6 and the pixel electrode of the organic light emitting diode OLED, and a second initialization source area of the second initialization transistor T7 may be connected to the initialization voltage line VIL. The second initialization transistor T7 may be turned on according to the next scan signal Sn+1 received through the next scan line SLn and initialize the pixel electrode of the organic light emitting diode OLED with the initialization voltage Vint.

FIG. 2 illustrates that the second initialization transistor T7 is connected to the next scan line SLn as illustrated in FIG. 2. In other embodiments, the second initialization transistor T7 may be connected to other signal lines. For example, the second initialization transistor T7 may be connected to the emission control line EL and driven according to the emission control signal En.

The storage capacitor Cap may include the first electrode CE1 and a second electrode CE2. The first electrode CE1 of the storage capacitor Cap may be connected to the driving gate electrode of the driving transistor T1, and the second electrode CE2 of the storage capacitor Cap may be connected to the driving voltage line PL. The storage capacitor Cap may store a charge corresponding to the difference between the driving voltage ELVDD and the driving gate electrode voltage of the driving transistor T1. An opposite electrode of the organic light emitting diode OLED may be connected to a common voltage ELVSS. Accordingly the driving current $I_{OLED}$ may flow through the organic light emitting diode OLED, and the light emitting diode OLED may emit light to display an image.

The boost capacitor Cbt may include a third electrode CE3 and a fourth electrode CE4. The third electrode CE3 may be connected to the switching gate electrode of the switching transistor T2 and the first scan line SL1, and the fourth electrode CE4 may be connected to the compensation source area of the compensation transistor T3 and the node connection line 161 at a first node N1. The boost capacitor Cbt may increase the voltage of the first node N1 when the first scan signal Sn provided via the first scan line SL1 is turned off. As such, when the voltage of the first node N1 is increased, a black gradation may be clearly expressed.

The first node N1 may connect the driving gate electrode of the driving transistor T1, the source area of the compensation transistor T3, the drain area of the first initialization transistor T4, the first electrode CE1 of the storage capacitor Cap, and the fourth electrode CE4 of the boost capacitor Cbt.

An exemplary operation of each pixel PX according to an embodiment may be described as follows.

During an initialization period, the first initialization transistor T4 may be turned on in response to the previous scan signal Sn−1 provided through the previous scan line SLp, and the driving transistor T1 may be initialized with the initialization voltage Vint provided via the initialization voltage line VIL.

During a data programming period, the switching transistor T2 and the compensation transistor T3 may be turned on in response to the first scan signal Sn provided via the first scan line SL1 and the second scan signal Sn' provided via the second scan line SL2. In this case, the driving transistor T1 may be diode-connected and forward-biased by the turned-on compensation transistor T3.

When the driving transistor T1 is diode-connected, a compensation voltage may be applied to the driving gate electrode of the driving transistor T1. The compensation voltage may be obtained by subtracting a threshold voltage Vth of the driving transistor T1 from the data signal Dm provided via the data line DL and expressed by Dm+Vth, where Vth is a negative value.

The driving voltage ELVDD and the compensation voltage Dm+Vth may be respectively applied to the first electrode CE1 and the second electrode CE2 of the storage capacitor Cap, and a charge corresponding to the voltage difference may be stored in the storage capacitor Cap.

During a light emission period, the operation control transistor T5 and the emission control transistor T6 may be turned on by the emission control signal En provided via the emission control line EL. The driving current $I_{OLED}$ may flow through the organic light emitting diode OLED according to the voltage difference between the driving voltage ELVDD and the voltage of the driving gate electrode of the driving transistor T1 applied to the pixel electrode of the organic light emitting diode OLED through the emission control transistor T6.

Meanwhile, the positions of source areas and drain areas of FIG. 2 may be interchanged depending on the types (p-type or n-type) of the transistors T1 through T7.

In the present embodiment, at least one of the transistors T1, T2, T3, T4, T5, T6, and T7 may include a semiconductor layer including oxide, and the other transistors may include a semiconductor layer including silicon.

For example, the driving transistor T1 that may directly affect the brightness of the display apparatus may include a semiconductor layer including polycrystalline silicon imparting high reliability, and accordingly, a high-resolution display apparatus may be implemented.

Meanwhile, because an oxide semiconductor may have a high carrier mobility and a low leakage current, a voltage drop of a transistor including an oxide semiconductor may not be great even when a driving time thereof is long. That is, such a transistor including an oxide semiconductor may be adequate for low-frequency driving because a color change of an image due to a voltage drop may not be great.

In one embodiment, at least one of the compensation transistor T3, the first initialization transistor T4, and the second initialization transistor T7 connected to the driving gate electrode of the driving transistor T1 may include an oxide semiconductor having a small leakage current to reduce power consumption while reducing a leakage current that may flow to the driving gate electrode of the driving transistor T1. In one embodiment, the compensation transistor T3 may include an oxide semiconductor. In other embodiments, the compensation transistor T3 and the first initialization transistor T4 may include an oxide semiconductor.

Although FIG. 2 illustrates the pixel circuit PC including seven thin film transistors T1 through T7 and two capacitors Cap and Cbt, the present disclosure is not limited thereto. The number of thin film transistors and the number of capacitors included in the pixel circuit PC may be variously modified according to the design of the pixel circuit PC. The boost capacitor Cbt may be omitted according to some embodiments.

Figure 3:
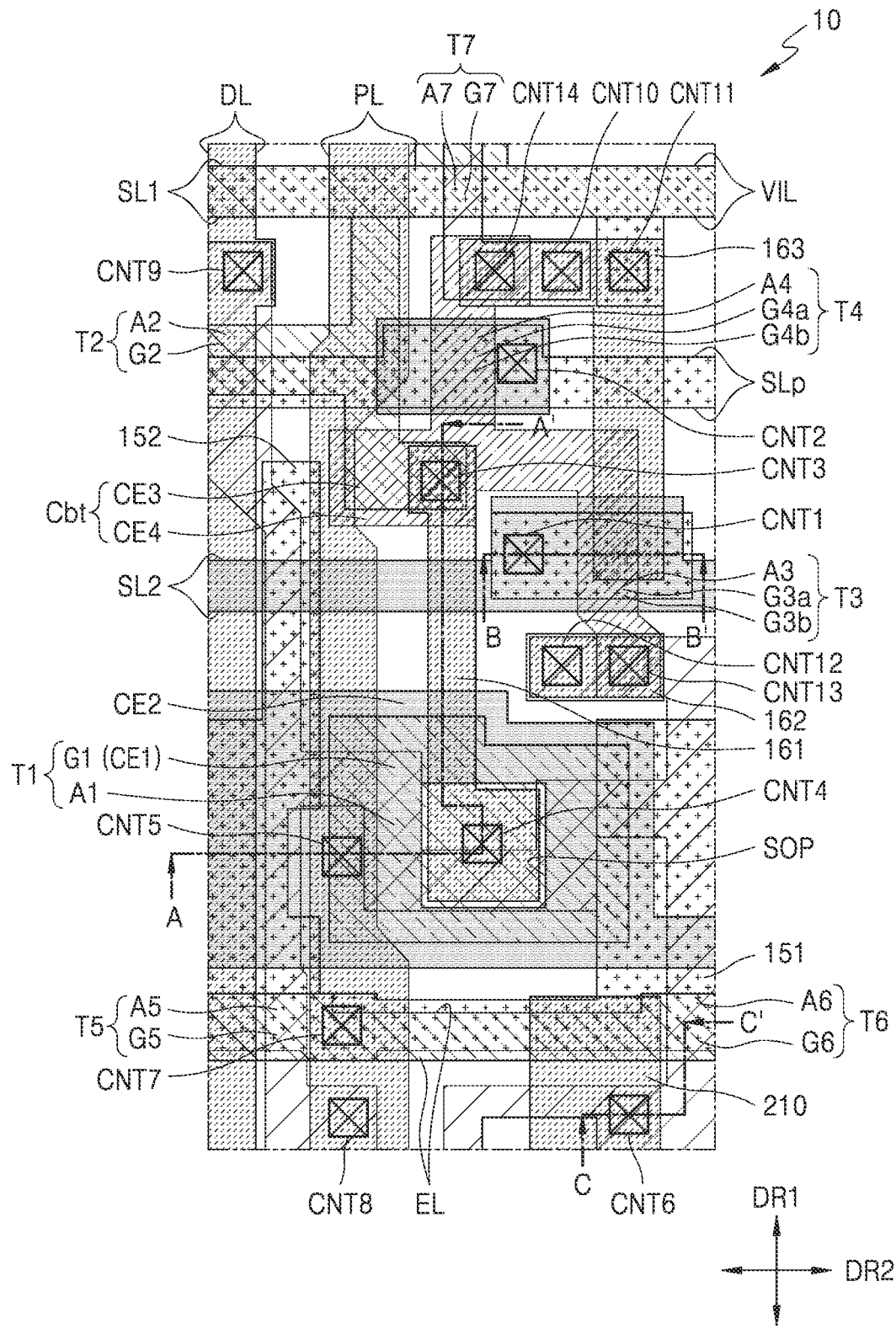
FIG. 3 is a schematic diagram of a pixel circuit included a display panel according to an embodiment.

FIG. 3 is a schematic diagram of the pixel circuit PC included the display panel 10 according to an embodiment, and FIGS. 4 to 9 are schematic diagrams illustrating layer-by-layer configurations of the display panel 10 shown in FIG. 3.

The display panel 10 may include a plurality of insulating layers. In one embodiment, a first gate insulating layer 112 (see FIG. 10) may be located between the layer illustrated in FIG. 4 and the layer illustrated in FIG. 5, a first interlayer insulating layer 113 (see FIG. 10) may be located between the layer illustrated in FIG. 5 and the layer illustrated in FIG. 6, a second interlayer insulating layer 114 (see FIG. 10) may be located between the layer illustrated in FIG. 6 and the layer illustrated in FIG. 7, a second gate insulating layer 115 (see FIG. 10) may be located between the layer illustrated in FIG. 7 and the layer illustrated in FIG. 8, and a third interlayer insulating layer 116 (see FIG. 10) may be located between the layer illustrated in FIG. 8 and the layer illustrated in FIG. 9. Contact holes or the like may be formed in the insulating layers, and the layered structures of the display panel 10 illustrated in FIGS. 4 to 9 may be vertically and electrically connected to each other.

Hereinafter, the structure and arrangement of the thin film transistors T1 through T7, the signal lines SL1, SL2, SLp, SLn, EL, DL, PL, VIL, and a horizontal driving voltage line 151, a shield line 152, the node connection line 161, and first and second connection electrodes 162 and 163 will be described with reference to FIGS. 3 through 9.

Referring to FIG. 3, the pixel circuit PC may include the driving transistor T1, the switching transistor T2, the compensation transistor T3, the first initialization transistor T4, the operation control transistor T5, the emission control transistor T6, the second initialization transistor T7, the storage capacitor Cap, and the boost capacitor Cbt.

The pixel circuit PC may further include the data line DL and the driving voltage line PL extending substantially in the first direction DR1, the first scan line SL1, the second scan line SL2, the previous scan line SLp, the emission control line EL, the horizontal driving voltage line 151, and the initialization voltage line VIL extending substantially in the second direction DR2 intersecting the first direction DR1, and the shield line 152, the node connection line 161, the first connection electrode 162, and the second connection electrode 163.

The driving transistor T1 may include a driving semiconductor layer A1 and a driving gate electrode G1, the switching transistor T2 may include a switching semiconductor layer A2 and a switching gate electrode G2, the compensation transistor T3 may include a compensation semiconductor layer A3 and a compensation gate electrode G3, the first initialization transistor T4 may include a first initialization semiconductor layer A4 and a first initialization gate electrode G4, the operation control transistor T5 may include an operation control semiconductor layer A5 and an operation control gate electrode G5, the emission control transistor T6 may include an emission control semiconductor layer A6 and an emission control gate electrode G6, and the second initialization transistor T7 may include a second initialization semiconductor layer A7 and a second initialization gate electrode G7.

In one embodiment, the driving semiconductor layer A1 of the driving transistor T1, the switching semiconductor layer A2 of the switching transistor T2, the operation control semiconductor layer A5 of the operation control transistor T5, the emission control semiconductor layer A6 of the emission control transistor T6, and the second initialization semiconductor layer A7 of the second initialization transistor T7 may be a silicon semiconductor layer including a silicon semiconductor, and the compensation semiconductor layer A3 of the compensation transistor T3 and the first initialization semiconductor layer A4 of the first initialization transistor T4 may be an oxide semiconductor layer including an oxide semiconductor.

In other embodiments, the driving semiconductor layer A1 of the driving transistor T1, the switching semiconductor layer A2 of the switching transistor T2, the first initialization semiconductor layer A4 of the first initialization transistor T4, the operation control semiconductor layer A5 of the operation control transistor T5, the emission control semiconductor layer A6 of the emission control transistor T6, and the second initialization semiconductor layer A7 of the second initialization transistor T7 may be a silicon semiconductor layer including a silicon semiconductor, and the compensation semiconductor layer A3 of the compensation transistor T3 may be an oxide semiconductor layer including an oxide semiconductor.

Hereinafter, an embodiment in which the compensation semiconductor layer A3 of the compensation transistor T3 and the first initialization semiconductor layer A4 of the first initialization transistor T4 include an oxide semiconductor, and the semiconductor layers A1, A2, A5, A6, and A7 of the other thin film transistors T1, T2, T5, T6, and T7 include a silicon semiconductor will be described; however, it is understood that the present disclosure is not limited thereto.

Figure 4:
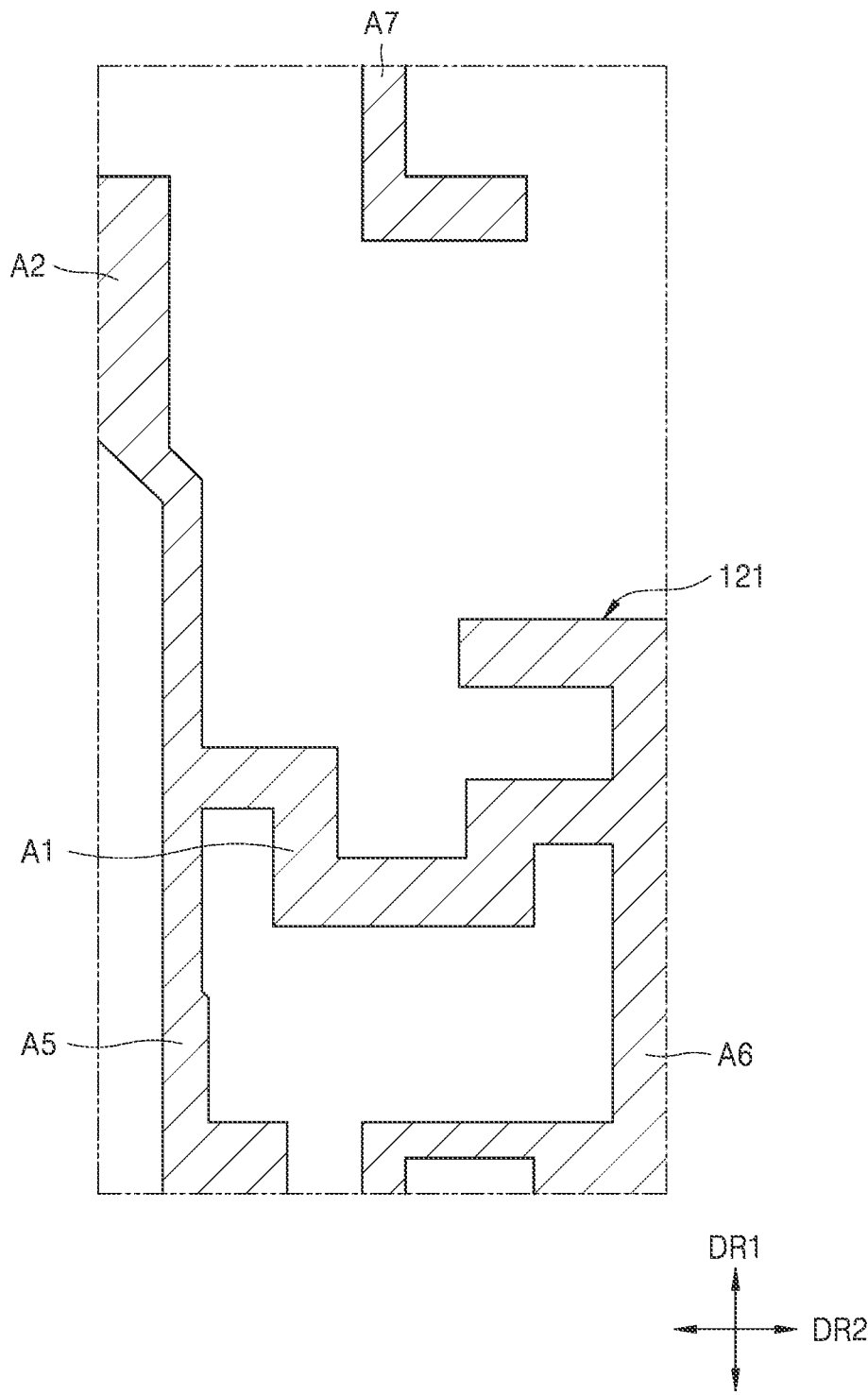
FIG. 4, FIG. 5, FIG. 6, FIG. 7, FIG. 8, and FIG. 9 are schematic diagrams illustrating layer-by-layer configurations of the display panel shown in FIG. 3.

Referring to FIGS. 3 and 4, a silicon semiconductor layer 121 may include the driving semiconductor layer A1, the switching semiconductor layer A2, the operation control semiconductor layer A5, the emission control semiconductor layer A6, and the second initialization semiconductor layer A7. The silicon semiconductor layer 121 may be formed of polycrystalline silicon or amorphous silicon. The driving semiconductor layer A1, the switching semiconductor layer A2, the operation control semiconductor layer A5, the emission control semiconductor layer A6, and the second initialization semiconductor layer A7 may be arranged on the same layer and include the same material.

At least one of the driving semiconductor layer A1, the switching semiconductor layer A2, the operation control semiconductor layer A5, the emission control semiconductor layer A6, and the second initialization semiconductor layer A7 may be bent in various shapes.

The driving semiconductor layer A1, the switching semiconductor layer A2, the operation control semiconductor layer A5, the emission control semiconductor layer A6, and the second initialization semiconductor layer A7 may be connected to each other. FIG. 4 illustrates the silicon semiconductor layer 121 included in the pixel circuit PC of the (n)th row, and the second initialization semiconductor layer A7 may be connected to the silicon semiconductor layer 121 included in the pixel circuit PC of the (n–1)th row.

Each of the driving semiconductor layer A1, the switching semiconductor layer A2, the operation control semiconductor layer A5, the emission control semiconductor layer A6, and the second initialization semiconductor layer A7 may include a channel area, and a source area and a drain area on both sides of the channel area. For example, the source area and the drain area may be doped with dopants, and the dopants may include N-type dopants or P-type dopants. The channel area may be an area overlapping a gate electrode of the corresponding thin film transistor described below with reference to FIG. 5, and may not be doped with dopants or may include a small amount of dopants. The source area and the drain area may correspond respectively to a source electrode and a drain electrode of the thin film transistor. The source area and the drain area may be interchanged depending on the property of the transistor. Hereinafter, the terms "source area" and "drain area" may be used instead of the source electrode and the drain electrode.

The driving semiconductor layer A1 may include a driving channel area, and a driving source area and a driving drain area on both sides of the driving channel area. One end of the driving semiconductor layer A1 may be connected to the switching semiconductor layer A2 and the operation control semiconductor layer A5, and the other end of the driving semiconductor layer A1 may be connected to the compensation semiconductor layer A3 through the first connection electrode 162 (see FIG. 9) and the emission control semiconductor layer A6.

The driving semiconductor layer A1, for example, the channel area of the driving semiconductor layer A1, may have a bent shape and may be formed longer than the other semiconductor layers A2 through A7. For example, the channel area of the driving semiconductor layer A1 may have a long channel length in a narrow space when the driving semiconductor layer A1 has a shape that is bent multiple times, such as an omega (Ω) shape or an alphabet "S" shape. Because the driving semiconductor layer A1 is formed long, the driving range of a gate voltage applied to the driving gate electrode G1 may widen, and thus the grayscale of light emitted from the organic light emitting diode OLED may be more finely controlled, and hence the display quality of the display panel 10 may be improved.

The switching semiconductor layer A2 may include a switching channel area, and a switching source area and a switching drain area on both sides of the switching channel area. One of the switching source area and the switching drain area may be connected to the driving source area or the driving drain area of the driving semiconductor layer A1, and the other one may be connected to the data line DL through a ninth contact hole CNT9 (see FIG. 9).

The operation control semiconductor layer A5 may include an operation control channel area, and an operation control source area and an operation control drain area on both sides of the operation control channel area. One of the operation control source area and the operation control drain area may be connected to one of the driving source area and the driving drain area of the driving semiconductor layer A1, and the other one may be connected to the driving voltage line PL through a seventh contact hole CNT7 (see FIG. 9).

The emission control semiconductor layer A6 may include an emission control channel area, and an emission control source area and an emission control drain area on both sides of the emission control channel area. One of the emission control source area and the emission control drain area may be connected to one of the driving drain area and the driving source area of the driving semiconductor layer A1, and the other one may be connected to a pixel electrode 210 of the organic light emitting diode OLED through a sixth contact hole CNT6 (see FIG. 9).

The second initialization semiconductor layer A7 may include a second initialization channel area, and a second initialization source area and a second initialization drain area on both sides of the second initialization channel area. One of the second initialization source area and the second initialization drain area may be connected to the emission control semiconductor layer A6. The other one of the second initialization source area and the second initialization drain area may be connected to the initialization voltage line VIL through the second connection electrode 163 (see FIG. 9).

Figure 5:
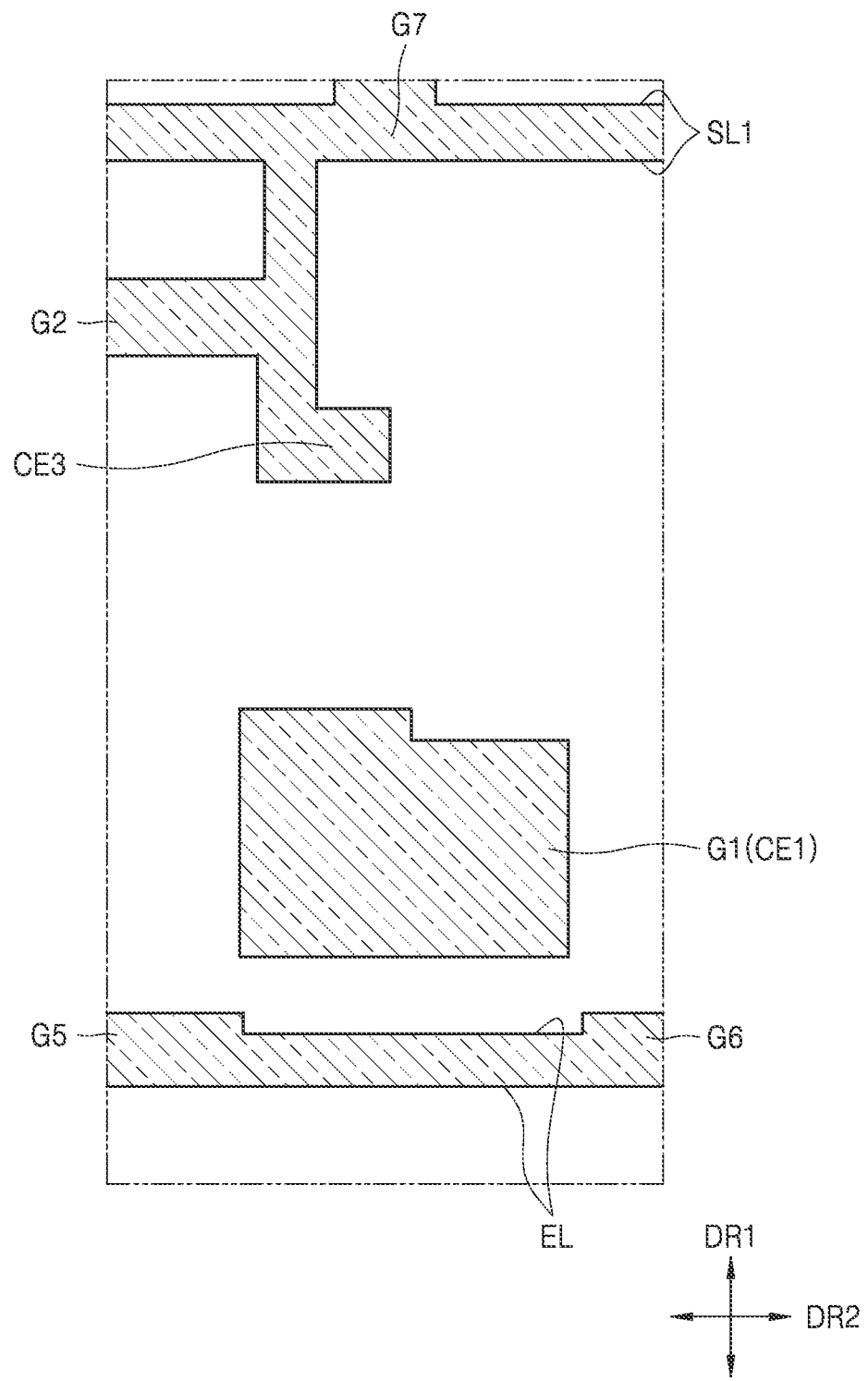

Referring to FIGS. 3 and 5, the driving gate electrode G1, the switching gate electrode G2, the operation control gate electrode G5, the emission control gate electrode G6, the second initialization gate electrode G7, the first scan line SL1, and the emission control line EL may be formed on the silicon semiconductor layer 121.

The driving gate electrode G1, the switching gate electrode G2, the operation control gate electrode G5, the emission control gate electrode G6, the second initialization gate electrode G7, the first scan line SL1, and the emission control line EL may be arranged on the same layer and may include the same material. For example, the gate electrodes G1, G2, G5, G6, and G7 may be arranged over the silicon semiconductor layer 121 with the first gate insulating layer 112 (see FIG. 10) therebetween. The gate electrodes G1, G2, G5, G6, and G7 may include molybdenum (Mo), titanium (Ti), or the like and may include a single layer or multiple layers.

The driving gate electrode G1 may be arranged to overlap the channel area of the driving semiconductor layer A1 and may correspond to the first electrode CE1 of the storage capacitor Cap.

The storage capacitor Cap may be formed to overlap the driving transistor T1, and the storage capacitor Cap may include the first electrode CE1 and the second electrode CE2 arranged with the first interlayer insulating layer 113 (see FIG. 10) therebetween. Here, the driving gate electrode G1 may simultaneously serve as the first electrode CE1 as well as the driving gate electrode G1 of the driving transistor T1. That is, the driving gate electrode G1 may be integrally formed with the first electrode CE1. The first interlayer insulating layer 113 (see FIG. 10) may serve as a dielectric layer of the storage capacitor Cap, and the storage capacitance of the storage capacitor Cap may be determined by a charge stored in the storage capacitor Cap between the first electrode CE1 and the second electrode CE2. The first electrode CE1 may have an isolated shape or an island shape. Hereinafter, the expressions, an island shape and an isolated shape may be interchangeably used.

The switching gate electrode G2 may be arranged to overlap the channel area of the switching semiconductor layer A2 and may extend to connect to the first scan line SL1.

The operation control gate electrode G5 may be arranged to overlap the channel area of the operation control semiconductor layer A5 and may extend to connect to the emission control line EL.

The emission control gate electrode G6 may be arranged to overlap the channel area of the emission control semiconductor layer A6 and may extend to connect to the emission control line EL. The operation control gate electrode G5, the emission control gate electrode G6, and the emission control line EL may be integrally formed.

The second initialization gate electrode G7 may be arranged to overlap the channel area of the second initialization semiconductor layer A7 and may extend to connect to the next scan line SLn. FIG. 5 illustrates the pixel circuit PC of the (n)th row, and the second initialization gate electrode G7 may be included in the pixel circuit PC of the (n−1)th row, so the next scan line SLn in the pixel circuit PC of the (n−1)th row may correspond to the first scan line SL1 of the pixel circuit PC of the (n)th row.

Meanwhile, in one embodiment, the pixel circuit PC may include the boost capacitor Cbt. The boost capacitor Cbt may include the third electrode CE3 and the fourth electrode CE4. The third electrode CE3 and the fourth electrode CE4 may be arranged with one or more insulating layers therebetween. The third electrode CE3 may be integrally formed with the first scan line SL1 and may be connected to the switching gate electrode G2.

Figure 6:
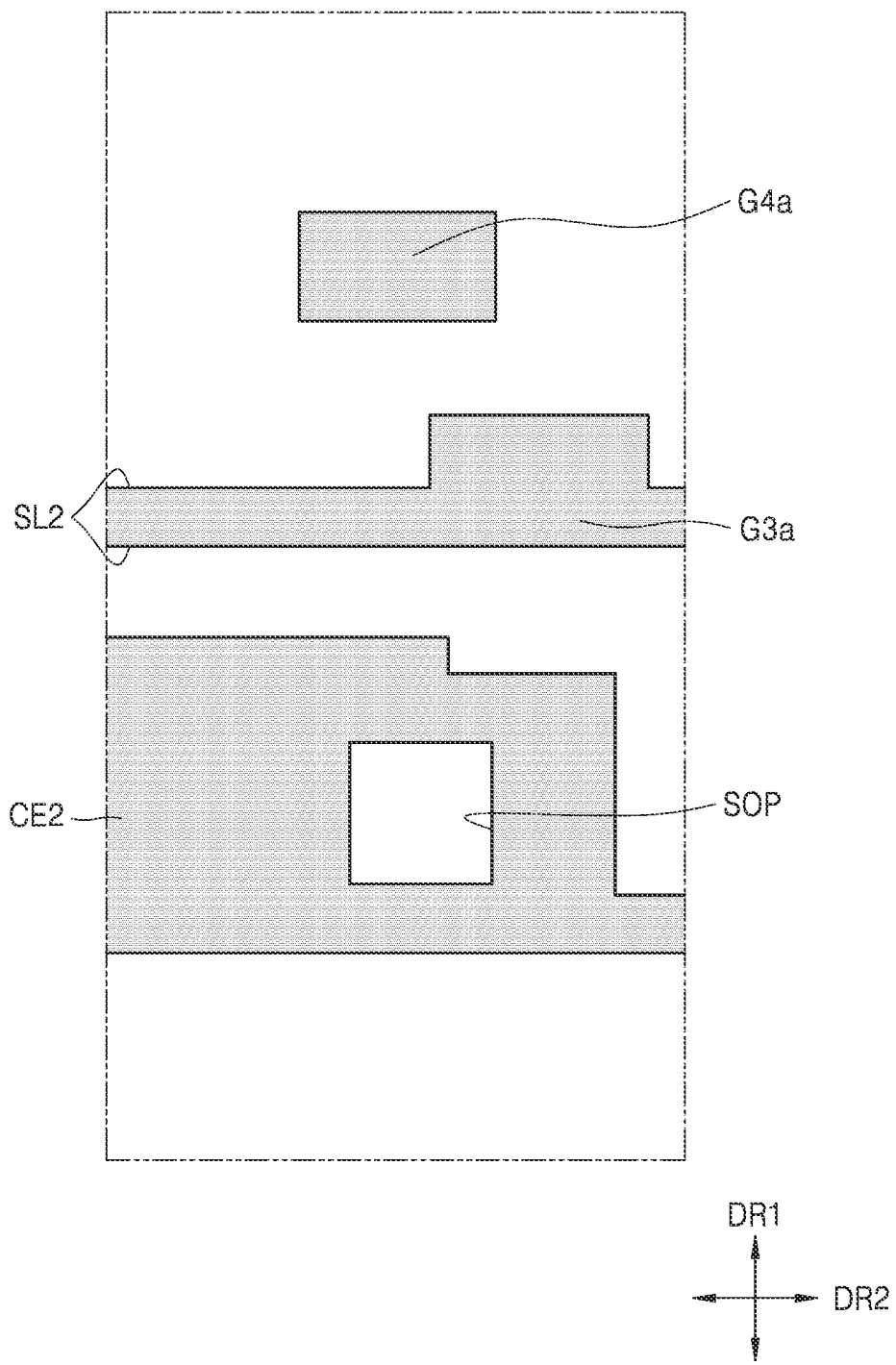

Referring to FIGS. 3 and 6, the second scan line SL2, the second electrode CE2 of the storage capacitor Cap, a first lower gate electrode G3a of the compensation transistor T3, and a second lower gate electrode G4a of the first initialization transistor T4 may be formed on the layer shown in FIG. 5 including the gate electrodes G1, G2, G5, G6, and G7, the first scan line SL1, and the emission control line EL.

The second scan line SL2, the second electrode CE2, the first lower gate electrode G3a, and the second lower gate electrode G4a may be arranged on the same layer and may include the same material. For example, the second scan line SL2, the second electrode CE2, the first lower gate electrode G3a, and the second lower gate electrode G4a may be arranged on the first interlayer insulating layer 113 (see FIG. 10).

The second electrode CE2 may be arranged to overlap the first electrode CE1, and in this case, the first interlayer insulating layer 113 may serve as a dielectric layer of the storage capacitor Cap.

The second electrode CE2 may include a storage opening SOP. The storage opening SOP may be arranged to overlap the first electrode CE1. The storage opening SOP may have a closed shape within the second electrode CE2. Here, the closed shape may refer to a shape having the same start and end points when a point is drawn on a straight line or a curve such as a polygon or a circle. The second electrode CE2 may be connected to the driving voltage line PL through a fifth contact hole CNT5 to receive the driving voltage ELVDD (see FIG. 2 and FIG. 10).

The first lower gate electrode G3a may extend to connect to the second scan line SL2, and the second lower gate electrode G4a may be formed in an island shape.

Figure 7:
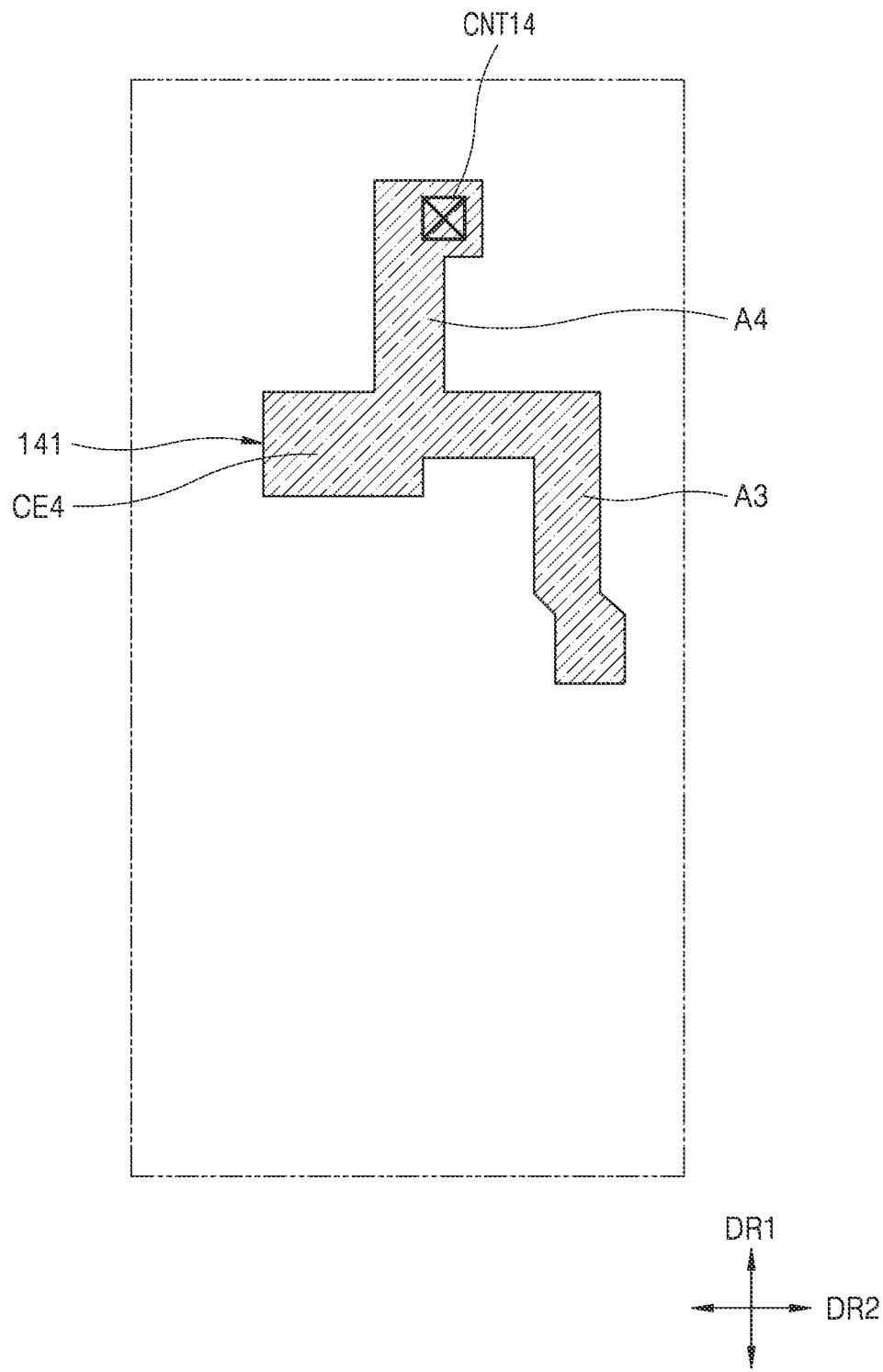

Referring to FIGS. 3 and 7, an oxide semiconductor layer 141 may be arranged on the layer shown in FIG. 6 including the second scan line SL2, the second electrode CE2, the first lower gate electrode G3a, and the second lower gate electrode G4a. The oxide semiconductor layer 141 may include the compensation semiconductor layer A3 and the first initialization semiconductor layer A4. The compensation semiconductor layer A3 and the first initialization semiconductor layer A4 are integrally formed with each other and may have an isolated shape. For example, the oxide semiconductor layer 141 may include an oxide semiconductor material including an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the oxide semiconductor material may be an In—Ga—Zn—O (IGZO) semiconductor material including metals such as indium (In) and gallium (Ga) in ZnO.

The oxide semiconductor layer 141 may include a channel area and a source area and a drain area on both sides of the channel area. For example, the source area and the drain area may correspond to an area in which a carrier concentration is increased by plasma treatment. The source area and the drain area may correspond respectively to a source electrode and a drain electrode. The source area and the drain area may be interchanged depending on the property of the transistor. Hereinafter, the terms "source area" and "drain area" may be used instead of the source electrode and the drain electrode.

The compensation semiconductor layer A3 may include a compensation channel area, and a compensation source area and a compensation drain area on both sides of the compensation channel area. One of the compensation source area and the compensation drain area may be bridge-connected to the first electrode CE1 of the storage capacitor Cap through the node connection line 161, and the other one may be bridge-connected to the silicon semiconductor layer 121 through the first connection electrode 162. The compensation semiconductor layer A3 may be connected to the driving semiconductor layer A1 of the driving transistor T1 and the emission control semiconductor layer A6 of the emission control transistor T6 through the first connection electrode 162. Also, the compensation semiconductor layer A3 may be connected to the first initialization semiconductor layer A4 that is arranged on the same layer.

The first initialization semiconductor layer A4 may include a first initialization channel area, and a first initialization source area and a first initialization drain area on both sides of the first initialization channel area. One of the first initialization source area and the first initialization drain area may be bridge-connected to the first electrode CE1 of the storage capacitor Cap through the node connection line 161, and the other one may be connected to the silicon semiconductor layer 121 through a fourteenth contact hole CNT14. The first initialization semiconductor layer A4 may be connected to the second initialization semiconductor layer A7 of the second initialization transistor T7 through the contact hole.

The fourth electrode CE4 of the boost capacitor Cbt may extend to connect to the oxide semiconductor layer 141 and may be integrally formed with the compensation semiconductor layer A3 and the first initialization semiconductor layer A4. The fourth electrode CE4 may correspond to an area between the first initialization semiconductor layer A4 and the compensation semiconductor layer A3. Alternatively, the fourth electrode CE4 may correspond to a portion extending from the first initialization semiconductor layer A4 or the compensation semiconductor layer A3. The fourth electrode CE4 may be arranged to overlap the third electrode CE3.

Figure 8:
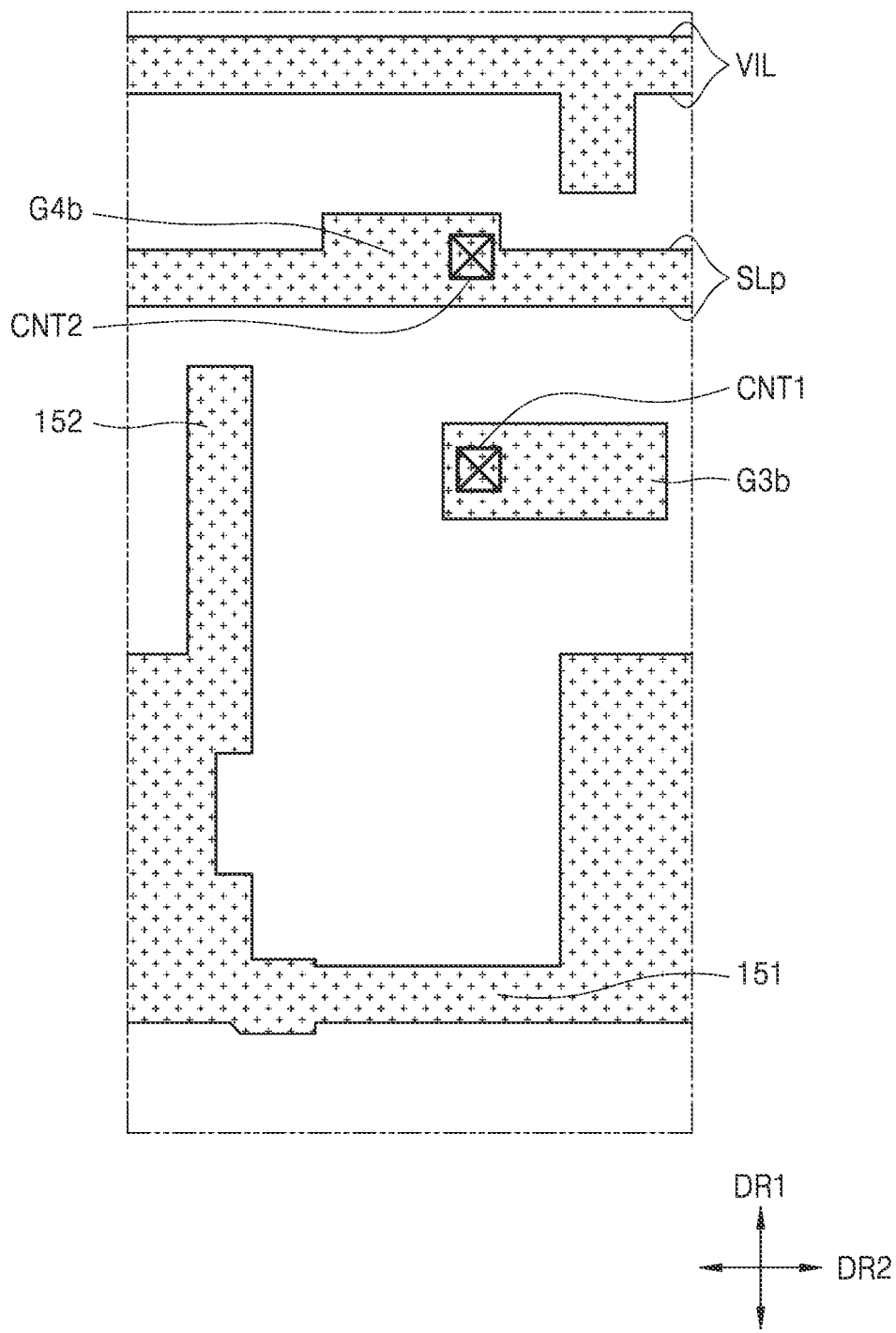

Referring to FIGS. 3 and 8, the initialization voltage line VIL, the previous scan line SLp, the horizontal driving voltage line 151, the shield line 152, a first upper gate electrode G3b of the compensation transistor T3, and a second upper gate electrode G4b of the first initialization transistor T4 may be arranged on the oxide semiconductor layer 141 shown in FIG. 7. The initialization voltage line VIL, the previous scan line SLp, the horizontal driving voltage line 151, the shield line 152, the first upper gate electrode G3b, and the second upper gate electrode G4b may be arranged on the same layer and may include the same material. For example, the initialization voltage line VIL, the previous scan line SLp, the horizontal driving voltage line 151, the shield line 152, the first upper gate electrode G3b, and the second upper gate electrode G4b may be arranged on the second gate insulating layer 115 (see FIG. 10).

The initialization voltage line VIL may extend in the second direction DR2 and may be bridge-connected to the second initialization semiconductor layer A7 through the second connection electrode 163.

The horizontal driving voltage line 151 may also extend in the second direction DR2. The horizontal driving voltage line 151 may be connected through the seventh contact hole CNT7 to the driving voltage line PL that extends in the first direction DR1 (see FIG. 9). Thus, the horizontal driving voltage line 151 and the driving voltage line PL may form a mesh structure and may have the same constant voltage.

The shield line 152 may extend from the horizontal driving voltage line 151 in the first direction DR1. The shield line 152 may be integrally formed with the horizontal driving voltage line 151 and may receive the driving voltage ELVDD applied through the horizontal driving voltage line 151 and the driving voltage line PL.

In one embodiment, the compensation transistor T3 may have a double gate structure, and the compensation gate electrode G3 of the compensation transistor T3 may include the first lower gate electrode G3a and the first upper gate electrode G3b overlapping a portion of the compensation semiconductor layer A3.

The first lower gate electrode G3a of the compensation transistor T3 may be arranged under the compensation semiconductor layer A3 and may extend to connect to the second scan line SL2. The first upper gate electrode G3b of the compensation transistor T3 may be arranged over the compensation semiconductor layer A3 and may be formed in an island shape. The first upper gate electrode G3b may be formed on the same layer and may include the same material as the initialization voltage line VIL, the previous scan line SLp, the horizontal driving voltage line 151, and the shield line 152.

Figure 10:
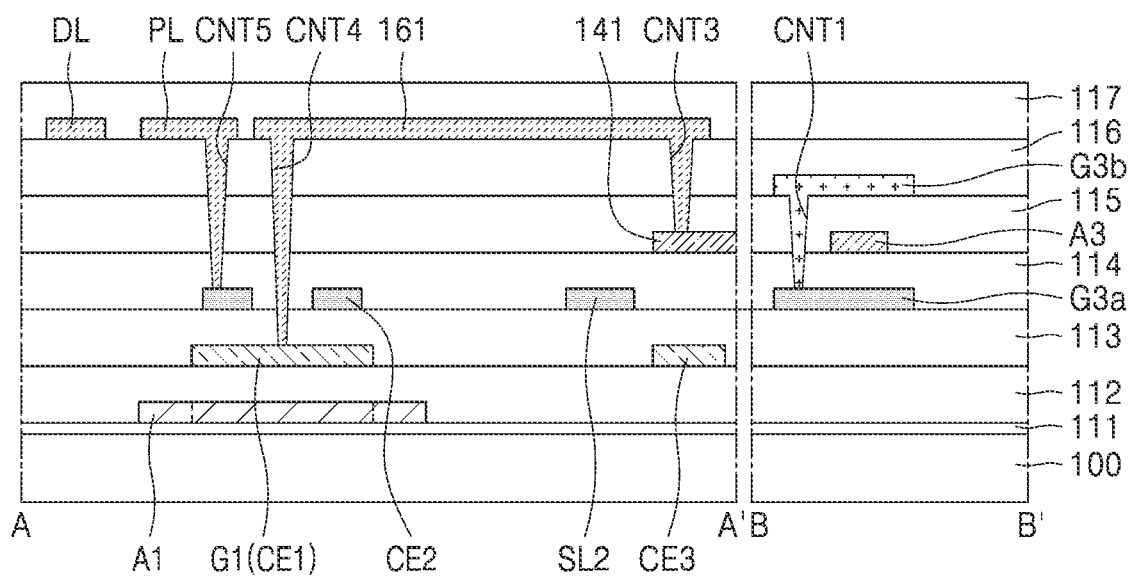
FIG. 10 is a cross-sectional view of the display panel taken along lines A-A' and B-B' of FIG. 3.

The first lower gate electrode G3a and the first upper gate electrode G3b may be located on opposite sides of the compensation semiconductor layer A3 in the cross-sectional view as shown in FIG. 10. Also, the first lower gate electrode G3a and the first upper gate electrode G3b may include different materials and may be electrically connected to each other through a first contact hole CNT1.

In one embodiment, the first initialization transistor T4 may have a double gate structure, and the first initialization gate electrode G4 of the first initialization transistor T4 may include the second lower gate electrode G4a and the second upper gate electrode G4b overlapping a portion of the first initialization semiconductor layer A4.

The second lower gate electrode G4a of the first initialization transistor T4 may be arranged under the first initialization semiconductor layer A4 and may be formed in an isolated shape. The second lower gate electrode G4a may be formed on the same layer and may include the same material as the second electrode CE2 of the storage capacitor Cap and the first lower gate electrode G3a of the compensation transistor T3. The second upper gate electrode G4b of the first initialization transistor T4 may be arranged over the first initialization semiconductor layer A4 and may extend to connect to the previous scan line SLp. The second upper gate electrode G4b may be formed on the same layer and may include the same material as the first upper gate electrode G3b.

The second lower gate electrode G4a and the second upper gate electrode G4b may be located on opposite sides of the first initialization semiconductor layer A4. Also, the second lower gate electrode G4a and the second upper gate electrode G4b may include different materials and may be electrically connected to each other through a second contact hole CNT2.

In other embodiments, the first initialization transistor T4 may have a single gate structure and may include only the second upper gate electrode G4b.

Figure 9:
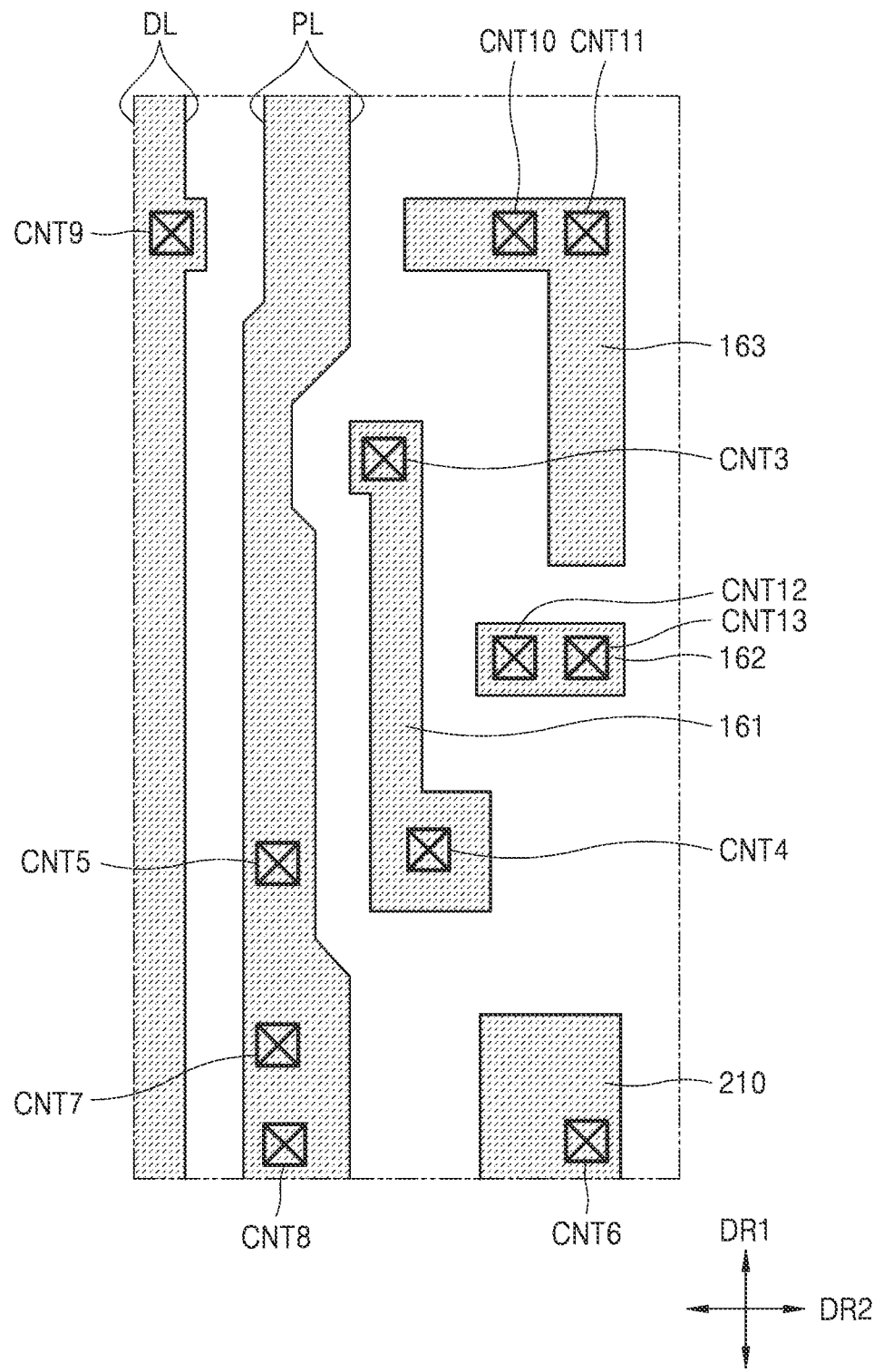

Referring to FIGS. 3 and 9, the data line DL, the driving voltage line PL, the node connection line 161, the first connection electrode 162, and the second connection electrode 163 may be arranged on the layer shown in FIG. 8 including the initialization voltage line VIL, the previous scan line SLp, the horizontal driving voltage line 151, the shield line 152, the first upper gate electrode G3b, and the second upper gate electrode G4b. The data line DL, the driving voltage line PL, the node connection line 161, the first connection electrode 162, and the second connection electrode 163 may be arranged on the same layer and may include the same material. For example, the data line DL, the driving voltage line PL, the node connection line 161, the first connection electrode 162, and the second connection electrode 163 may be arranged on the third interlayer insulating layer 116 (see FIG. 10). For example, the data line DL and the driving voltage line PL may include a conductive material including aluminum (Al), copper (Cu), titanium (Ti), molybdenum (Mo), or the like and may include a single layer or multiple layers including one or more of the above material. For example, the data line DL and the driving voltage line PL may have a multilayer structure of Ti/Al/Ti.

The data line DL may extend in the first direction DR1 and may be connected to the switching semiconductor layer A2 of the switching transistor T2 through the ninth contact hole CNT9, and thus the switching transistor T2 may receive the data signal Dm (see FIG. 2) via the data line DL.

The driving voltage line PL may also extend in the first direction DR1, may be connected to the operation control semiconductor layer A5 through an eighth contact hole CNT8, and may be connected to the second electrode CE2 of the storage capacitor Cap through the fifth contact hole CNT5. Thus, the operation control transistor T5 and the second electrode CE2 may receive the driving voltage ELVDD (see FIG. 2) via the driving voltage line PL.

The node connection line 161 may extend in the first direction DR1 and may connect the first electrode CE1 of the storage capacitor Cap to the compensation transistor T3 and the first initialization transistor T4. One end of the node connection line 161 may be connected through a third contact hole CNT3 to the oxide semiconductor layer 141 including the compensation semiconductor layer A3, the first initialization semiconductor layer A4, and the fourth electrode CE4. The other end of the node connection line 161 may be connected to the first electrode CE1 through a fourth contact hole CNT4.

The first connection electrode 162 may connect the silicon semiconductor layer 121 to the oxide semiconductor layer 141. One end of the first connection electrode 162 may be connected to the driving semiconductor layer A1 of the silicon semiconductor layer 121 through a twelfth contact hole CNT12. The other end of the first connection electrode 162 may be connected to the compensation semiconductor layer A3 of the oxide semiconductor layer 141 through a thirteenth contact hole CNT13.

The second connection electrode 163 may connect the second initialization transistor T7 to the initialization voltage line VIL. A portion of the second connection electrode 163 may be connected to the second initialization semiconductor layer A7 of the second initialization transistor T7 through a tenth contact hole CNT10. Another portion of the second connection electrode 163 may be connected to the initialization voltage line VIL through an eleventh contact hole CNT11. The second connection electrode 163 may include a portion extending in the first direction DR1.

In one embodiment, the pixel electrode 210 of the organic light emitting diode OLED may be arranged on the same layer as the data line DL and the driving voltage line PL. The pixel electrode 210 may be directly connected to the emission control semiconductor layer A6 of the emission control transistor T6 through the sixth contact hole CNT6 to receive a voltage signal applied through the emission control transistor T6.

Figure 11:
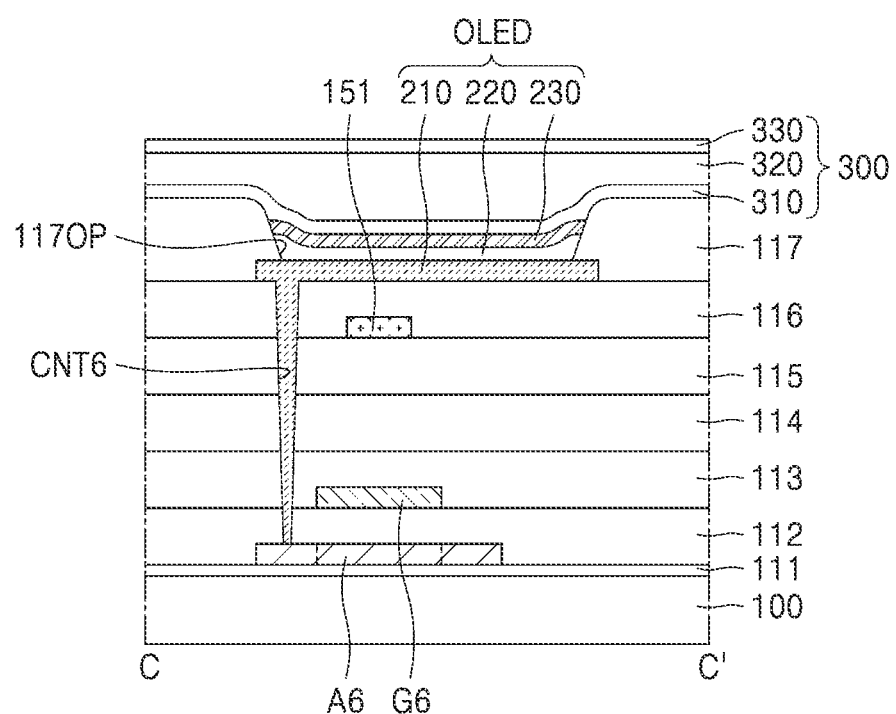
FIG. 11 is a cross-sectional view of the display panel taken along line C-C' of FIG. 3.

FIG. 10 is a cross-sectional view of the display panel 10 taken along lines A-A' and B-B' of FIG. 3, and FIG. 11 is a cross-sectional view of the display panel 10 taken along line C-C' of FIG. 3.

Referring to FIGS. 10 and 11, various signal lines, connection lines, electrodes, and layers described above may be formed on a substrate 100. The substrate 100 may include glass or a polymer resin. For example, the polymer resin of the substrate 100 may include polyether sulfone, polyacrylate, polyether imide, polyethylene naphthalate, polyethylene terephthalate, polyphenylene sulfide, polyarylate, polyimide, polycarbonate, and/or cellulose acetate propionate. The substrate 100 including the polymer resin may be flexible, rollable, and/or bendable. The substrate 100 may have a multilayer structure including an inorganic layer (not illustrated) and a layer including at least one of the above-described examples of the polymer resin.

A buffer layer 111 may be formed on the substrate 100. The buffer layer 111 may reduce or block penetration of foreign materials, moisture, or external air from the bottom of the substrate 100 and may provide a flat surface on the substrate 100. The buffer layer 111 may include an inorganic insulating material such as silicon oxide, silicon oxynitride, or silicon nitride and may be formed in a single-layer or have a multilayer structure including one or more of the inorganic insulating materials.

The silicon semiconductor layer 121 including the driving semiconductor layer A1, the switching semiconductor layer A2, the operation control semiconductor layer A5, the emission control semiconductor layer A6, and the second initialization semiconductor layer A7 as illustrated in FIG. 4 may be formed on the buffer layer 111. The first gate insulating layer 112 may be formed on the silicon semiconductor layer 121.

The driving gate electrode G1, the switching gate electrode G2, the operation control gate electrode G5, the emission control gate electrode G6, the second initialization gate electrode G7, the first scan line SL1, the emission control line EL, the first electrode CE1 of the storage capacitor Cap, and the third electrode CE3 of the boost capacitor Cbt illustrated in FIG. 5 may be formed on the first gate insulating layer 112. The first interlayer insulating layer 113 may be formed on the gate electrodes G1, G2, G5, G6, and G7.

The second scan line SL2, the first lower gate electrode G3a of the compensation transistor T3, the second lower gate electrode G4a of the first initialization transistor T4, and the second electrode CE2 of the storage capacitor Cap illustrated in FIG. 6 may be formed on the first interlayer insulating layer 113, and the second interlayer insulating layer 114 covering the same may be formed thereon.

The oxide semiconductor layer 141 including the compensation semiconductor layer A3 of the compensation transistor T3 and the first initialization semiconductor layer A4 of the first initialization transistor T4 and the fourth electrode CE4 of the boost capacitor Cbt illustrated in FIG. 7 may be formed on the second interlayer insulating layer 114, and the second gate insulating layer 115 covering the same may be formed thereon.

The previous scan line SLp, the initialization voltage line VIL, the horizontal driving voltage line 151, the shield line 152, the first upper gate electrode G3b of the compensation transistor T3, and the second upper gate electrode G4b of the first initialization transistor T4 illustrated in FIG. 8 may be formed on the second gate insulating layer 115, and the third interlayer insulating layer 116 covering the same may be formed thereon.

The first upper gate electrode G3b may be connected to the first lower gate electrode G3a through the first contact hole CNT1 that penetrates through the second interlayer insulating layer 114 and the second gate insulating layer 115. Thus, the first upper gate electrode G3b and the first lower gate electrode G3a may have the same potential.

The first gate insulating layer 112, the first interlayer insulating layer 113, the second interlayer insulating layer 114, the second gate insulating layer 115, and the third interlayer insulating layer 116 may include an inorganic insulating material such as silicon oxide, silicon oxynitride, or silicon nitride and may include a single-layer or have a multilayer structure including one or more of the inorganic insulating materials.

The data line DL, the driving voltage line PL, the node connection line 161, the first connection electrode 162, the second connection electrode 163, and the pixel electrode 210 illustrated in FIG. 9 may be formed on the third interlayer insulating layer 116.

One end of the node connection line 161 may be connected to the oxide semiconductor layer 141 through the third contact hole CNT3 that penetrates through the second gate insulating layer 115 and the third interlayer insulating layer 116. The other end of the node connection line 161 may be connected to the driving gate electrode G1 through the fourth contact hole CNT4 that penetrates through the first interlayer insulating layer 113, the second interlayer insulating layer 114, the second gate insulating layer 115, and the third interlayer insulating layer 116. Thus, the driving transistor T1 may be electrically connected to the compensation transistor T3, the first initialization transistor T4, and the boost capacitor Cbt by the node connection line 161.

The driving voltage line PL may be connected to the second electrode CE2 of the storage capacitor Cap through the fifth contact hole CNT5 that penetrates through the second interlayer insulating layer 114, the second gate insulating layer 115, and the third interlayer insulating layer 116. Thus, the second electrode CE2 may receive the driving voltage ELVDD (see FIG. 2) provided via the driving voltage line PL.

Referring to FIG. 11, the pixel electrode 210 of the organic light emitting diode OLED may be connected to one of the source electrode and the drain electrode of the emission control semiconductor layer A6 through the sixth contact hole that penetrates through the first gate insulating layer 112, the first interlayer insulating layer 113, the second interlayer insulating layer 114, the second gate insulating layer 115, and the third interlayer insulating layer 116.

The pixel electrode 210 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any combination or compound thereof. The pixel electrode 210 may further include a transparent conductive layer arranged over and/or under the reflection layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). In one embodiment, the pixel electrode 210 may have a three-layered structure of ITO layer/Ag layer/ITO layer that are sequentially stacked.

A pixel definition layer 117 may be arranged on the pixel electrode 210 and the third interlayer insulating layer 116. The pixel definition layer 117 may cover an edge of the pixel electrode 210 and may include an opening 1170P overlapping a center portion of the pixel electrode 210.

The pixel definition layer 117 may increase a distance between the edge of the pixel electrode 210 and an opposite electrode 230 of the organic light emitting diode OLED over the pixel electrode 210 to prevent an arc or the like from occurring at or near the edge of the pixel electrode 210. The pixel definition layer 117 may be formed of an organic insulating material such as polyimide, polyamide, acrylic resin, benzocyclobutene, hexamethyldisiloxane (HMDSO), or phenol resin by spin coating or the like.

An intermediate layer 220 of the organic light emitting diode OLED may be arranged on the pixel electrode 210 in the opening 1170P. The intermediate layer 220 may include a high-molecular or low-molecular weight organic material for emitting light representing a particular color.

The opposite electrode 230 of the organic light emitting diode OLED may be arranged on the intermediate layer 220 in the opening 1170P. The opposite electrode 230 may include a conductive material having a relatively low work function. For example, the opposite electrode 230 may include a transparent layer or a semi-transparent layer including silver (Ag), magnesium (Mg), aluminum (Al), nickel (Ni), chromium (Cr), lithium (Li), calcium (Ca), or any combination or alloy thereof. Alternatively, the opposite electrode 230 may further include a layer such as ITO, IZO, ZnO, or $In_2O_3$ on the transparent layer and/or the semi-transparent layer including one or more of the above-listed material. In one embodiment, the opposite electrode 230 may include silver (Ag) and/or magnesium (Mg). The opposite electrode 230 may be integrally formed to cover the display area DA of the display panel 10.

The stacked structure of the pixel electrode 210, the intermediate layer 220, and the opposite electrode 230 forms the organic light emitting diode OLED. The organic light emitting diode OLED may emit red, green, or blue light, and an emission area of each organic light emitting diode OLED may correspond to each pixel PX.

A thin film encapsulation layer 300 may be arranged on the opposite electrode 230 and the pixel definition layer 117. The organic light emitting diode OLED may be entirely covered by the thin film encapsulation layer 300. The thin film encapsulation layer 300 may include first and second inorganic encapsulation layers 310 and 330 and an organic encapsulation layer 320 therebetween.

The first and second inorganic encapsulation layers 310 and 330 may each include one or more inorganic insulating materials. The inorganic insulating material may include aluminum oxide ($Al_2O_3$), titanium oxide ($TiO_2$), tantalum oxide ($Ta_2O_5$), hafnium oxide ($HfO_2$), zinc oxide ($ZnO_2$), silicon oxide ($SiO_2$), silicon nitride ($SiN_x$), and/or silicon oxynitride (SiON). The first and second inorganic encapsulation layers 310 and 330 may be formed by chemical vapor deposition.

The organic encapsulation layer 320 may include a polymer-based material. The polymer-based material may include an acrylic resin, an epoxy resin, polyimide, polyethylene, or the like. For example, the organic encapsulation layer 320 may include an acrylic resin such as polymethylmethacrylate or polyacrylic acid. The organic encapsulation layer 320 may be formed by curing a monomer or applying a polymer.

In one embodiment, a via insulating layer (not illustrated) may be formed on the data line DL, the driving voltage line PL, the node connection line 161, the first connection electrode 162, and the second connection electrode 163. In this case, the via insulating layer may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof. The via insulating layer may include an inorganic material. The via insulating layer may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$). When the via insulating layer includes an inorganic material, chemical planarization polishing may be performed in some cases. In some embodiments, the via insulating layer may include both an organic material and an inorganic material.

An additional conductive layer (not illustrated) may be formed on the via insulating layer, and a planarization layer (not illustrated) may be formed on the conductive layer. In this case, the pixel electrode 210 may be arranged on the planarization layer. The planarization layer may include an organic material such as acrylic, benzocyclobutene (BCB), polyimide, or hexamethyldisiloxane (HMDSO). Alternatively, the planarization layer may include an inorganic material. The planarization layer may serve to substantially planarize an upper portion of a protection layer that covers the thin film transistors T1 through T7. The planarization layer may be provided as a single layer or multiple layers. As such, the additional conductive layer may be used to efficiently arrange the pixel circuit PC.

Figure 12:
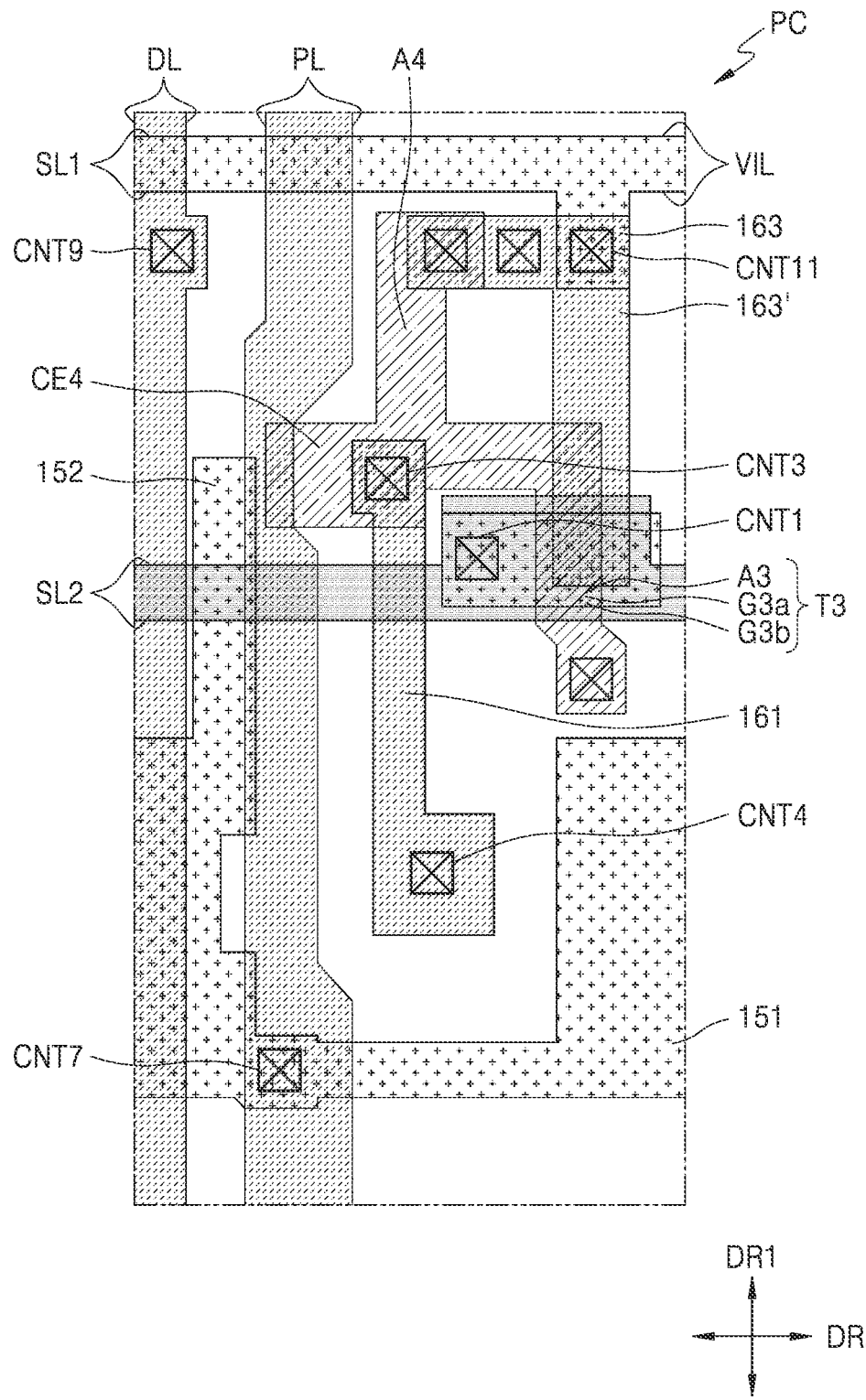
FIG. 12 is a schematic diagram selectively illustrating some configurations around a data line, a shield line, and a node connection line illustrated in FIG. 3.

FIG. 12 is schematic diagram selectively illustrating some configurations around of the data line DL, the shield line 152, and the node connection line 161 illustrated in FIG. 3. Like reference numerals as those used with reference to FIG. 3 denote like members, and thus redundant descriptions thereof will be omitted for conciseness.

Referring to FIG. 12, the pixel circuit PC may include the node connection line 161 electrically connecting the driving transistor T1 (see FIG. 3) that includes a silicon semiconductor and the compensation transistor T3 that includes an oxide semiconductor. The node connection line 161 may extend in the first direction DR1 and intersect the scan line (e.g., the second scan line SL2) extending in the second direction DR2, in a plan view. The node connection line 161 may be arranged between the compensation transistor T3 and the driving voltage line PL in the plan view.

The pixel circuit PC may be arranged between the data line DL and the node connection line 161 in the plan view and may include the shield line 152 that includes the same material as the first upper gate electrode G3b of the compensation transistor T3. The shield line 152 may connect to the horizontal driving voltage line 151 and extend from the horizontal driving voltage line 151 in the first direction DR1 intersecting the second scan line SL2 in the plan view. Also, the shield line 152 may be arranged between the data line DL and the driving voltage line PL in the plan view and may partially overlap the driving voltage line PL.

The pixel circuit PC may include the first upper gate electrode G3b formed in an isolated shape. The first upper gate electrode G3b may be directly connected to the first lower gate electrode G3a through the first contact hole CNT1 that penetrates through at least one insulating layer arranged between the first upper gate electrode G3b and the second scan line SL2.

As a comparative example in which the first upper gate electrode G3b may not be formed in an isolated shape, the first upper gate electrode G3b may connect to another scan line that extends in the second direction DR2. In this case, a line extending in the first direction DR1 may not be able to be arranged on a layer where the first upper gate electrode G3b is arranged.

However, according to one embodiment of the present disclosure, the first upper gate electrode G3b is formed in an isolated shape, therefore any line extending in the first direction DR1 may also be arranged on a layer where the first upper gate electrode G3b is arranged. Thus, in one embodiment, the shield line 152 may be arranged to extend from the horizontal driving voltage line 151 in the first direction DR1.

Because the shield line 152 may be integrally formed with the horizontal driving voltage line 151 and electrically connected to the driving voltage line PL through the horizontal driving voltage line 151, the shield line 152 may receive a constant voltage via the driving voltage line PL. Because the shield line 152 to which the constant voltage is applied may be arranged between the data line DL and the node connection line 161 in a plan view, it may be possible to reduce or minimize a parasitic capacitance that may occur between the data line DL and the node connection line 161 and crosstalk that may be caused by the parasitic capacitance. Accordingly, the display panel 10 is capable of providing high-quality images.

In the comparative case where the shield line 152 is not provided, a ratio of a distorted luminance value caused by crosstalk to an intended luminance value according to the data signal Dm (see FIG. 2) that is input to the pixel circuit PC may be about 1.5%. In contrast, according to an embodiment in which the shield line 152 is provided, the ratio of the distorted luminance value may decrease to about 0.24%.

Further, as a comparative example in which the first upper gate electrode G3b is not formed in an isolated shape and is connected to another scan line extending parallel to the second scan line SL2 in the second direction DR2, the node connection line 161 may intersect the other scan line in a plan view and may be adjacent to the other scan line with one insulating layer therebetween.

In contrast, according to an embodiment in which the first upper gate electrode G3b is formed in an isolated shape, the node connection line 161 may not intersect the first upper gate electrode G3b in a plan view and may be arranged over the second scan line SL2 with at least two insulating layers therebetween. Thus, a distance between the node connection line 161 and the second scan line SL2 may increase, and it may be possible to reduce or minimize the parasitic capacitance between the node connection line 161 and the second scan line SL2 and the crosstalk caused by the parasitic capacitance.

Because the first upper gate electrode G3b may be formed in an isolated shape, a space occupied by the compensation transistor T3 having a double gate structure may be reduced, and the pixel circuit PC may be more densely arranged. Thus, the display panel 10 may be implemented as a highly-integrated display panel. Further, by arranging the existing lines by utilizing the secured space, the number of masks used to manufacture the display panel 10 may be reduced, and thus the manufacturing efficiency thereof may be improved.

In one embodiment, the pixel circuit PC may include the second upper gate electrode G4b formed in an isolated shape. The second upper gate electrode G4b may be electrically connected to the second lower gate electrode G4a through the second contact hole CNT2 that penetrates through at least one insulating layer located between the second upper gate electrode G4b and the previous scan line SLp.

Referring to FIG. 12, the second connection electrode 163 may include a portion 163' that extends in the first direction DR1. The portion 163' may at least partially overlap the compensation transistor T3. An adjacent pixel circuit PC having the same structure may be arranged on the right side of the pixel circuit PC of FIG. 12. Thus, the portion 163' may be arranged between the compensation transistor T3 and the data line DL (not illustrated) of the adjacent pixel circuit PC in a plan view.

The second connection electrode 163 may be connected to the initialization voltage line VIL through the eleventh contact hole CNT11 and may receive a constant voltage applied through the initialization voltage line VIL. The portion 163' to which the constant voltage is applied may reduce or minimize the parasitic capacitance between the compensation transistor T3 and the data line DL of the adjacent pixel circuit PC and the crosstalk caused by the parasitic capacitance.

Figure 13:
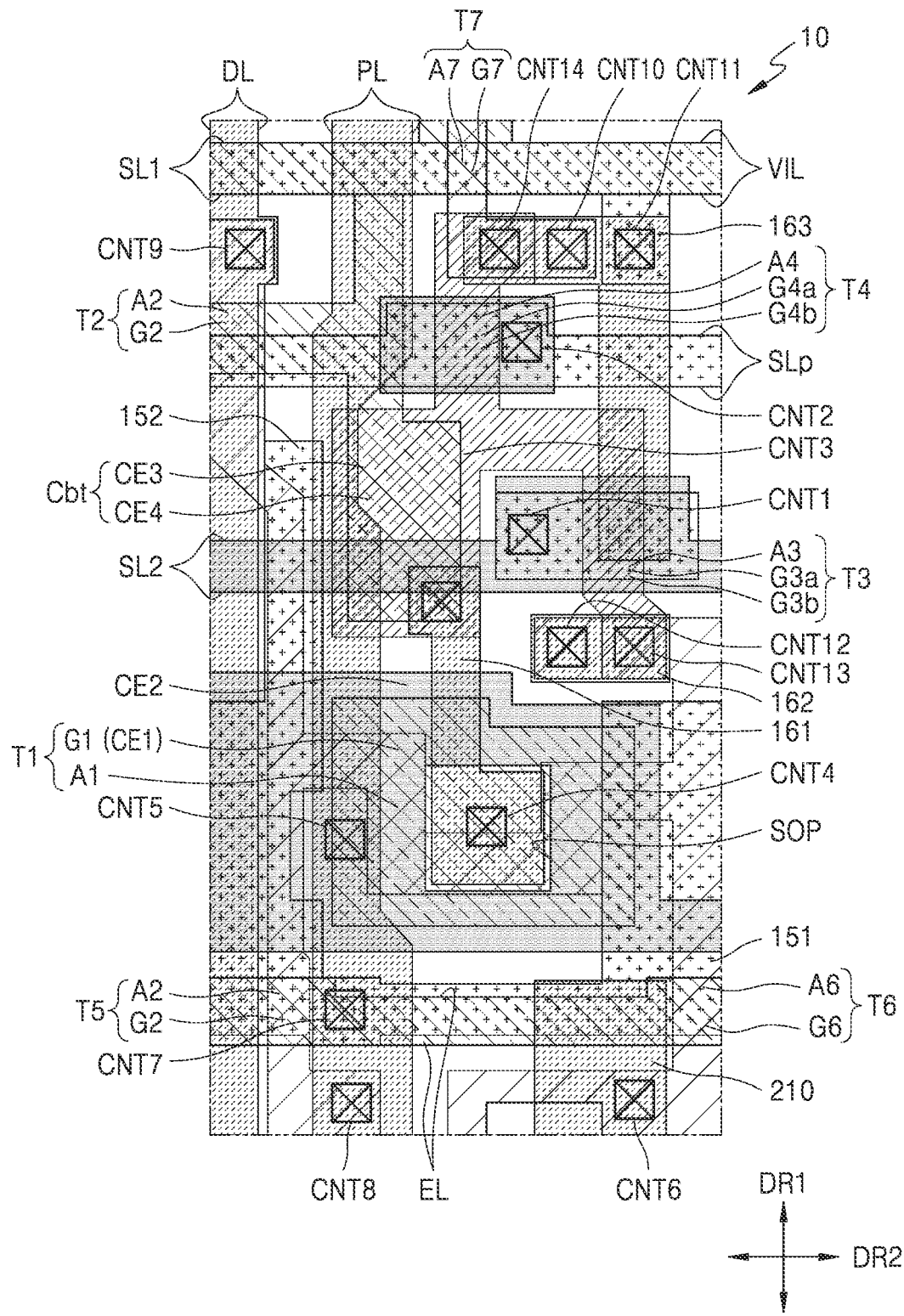
FIG. 13 is a schematic diagram of a pixel circuit included a display panel according to another embodiment.

FIG. 13 is a schematic diagram of the pixel circuit PC included the display panel 10 according to another embodiment. Descriptions of the same configurations as those in the pixel circuit PC of the display panel 10 described above with reference to FIG. 3 will be omitted, and the differences therebetween will be mainly described.

Referring to FIG. 13, the fourth electrode CE4 of the boost capacitor Cbt may extend in the first direction DR1 and may be arranged to intersect the second scan line SL2 in a plan view. The node connection line 161 may be electrically connected to the oxide semiconductor layer 141 through the third contact hole CNT3 that is closer to the driving transistor T1 than the second scan line SL2 in the plan view. Accordingly, a length of the node connection line 161 in the first direction DR1 may decrease, and a distance between the data line DL and the fourth electrode CE4 may increase, and therefore an occurrence of parasitic capacitance between the node connection line 161 and the data line DL or between the fourth electrode CE4 and the data line DL may be reduced. Thus, the display panel 10 is capable of providing high-quality images by reducing the crosstalk caused by the parasitic capacitance.

Although the display panel 10 has been mainly described above, the present disclosure is not limited thereto. For example, a manufacturing method for the display panel 10 may also fall within the scope of the present disclosure.

According to the embodiments described above, the pixel circuit PC may include at least one thin film transistor including a silicon semiconductor and another thin film transistor including an oxide semiconductor, and the shield line 152 may be provided between the data line DL and the node connection line 161 connecting the thin film transistors, thereby minimizing a parasitic capacitance that may occur between the node connection line 161 and the data line DL, and crosstalk caused by the parasitic capacitance.

Further, the thin film transistor including the oxide semiconductor may include double gate electrodes including an upper gate electrode and a lower gate electrode, and the upper gate electrode may be formed in an isolated shape and may be directly connected to the lower gate electrode through a contact hole, thereby reducing a space occupied by the thin film transistor.

Accordingly, the display panel 10 is capable of providing high-quality images while being highly integrated.

It should be understood that the embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as well as the following claims.

What is claimed is:

1. A display apparatus comprising a display area in which a plurality of pixels are disposed and a peripheral area disposed outside the display area, each of the plurality of pixels comprising:
   a driving transistor comprising a silicon semiconductor;
   a first transistor connected to a data line and the driving transistor and comprising a silicon semiconductor; and
   a second transistor connected to a gate electrode of the driving transistor and the silicon semiconductor of the driving transistor,
   wherein the second transistor comprises a first gate electrode, a second gate electrode and an oxide semiconductor disposed between the first gate electrode and the second gate electrode, and
   wherein one end of the oxide semiconductor of the second transistor is connected to the gate electrode of the driving transistor and the other end of the oxide semiconductor of the second transistor is connected to the silicon semiconductor of the driving transistor.

2. The display apparatus of claim 1, wherein the first gate electrode and the second gate electrode of the second transistor are electrically connected each other through a contact hole.

3. The display apparatus of claim 1, further comprising a first capacitor comprising a first electrode connected to the gate electrode of the driving transistor and a second electrode overlapping the first electrode and connected to a first voltage line.

4. The display apparatus of claim 1, further comprising a second capacitor comprising a third electrode connected to a gate electrode of the first transistor and a fourth electrode connected to the gate electrode of the driving transistor.

5. The display apparatus of claim 4, wherein the third electrode of the second capacitor and the gate electrode of the driving transistor are disposed on a same layer, and
   wherein the fourth electrode of the second capacitor and the oxide semiconductor of the second transistor are disposed on a same layer.

6. The display apparatus of claim 4, further comprising a scan line connected to the second transistor,
   wherein the data line extends in a first direction and the scan line extends in a second direction perpendicular to the first direction, and
   wherein the third electrode and the fourth electrode cross the scan line in the first direction.

7. The display apparatus of claim 1, further comprising a third transistor connected between the gate electrode of the driving transistor and a second voltage line, and
   wherein the third transistor comprises a first gate electrode, a second gate electrode and an oxide semiconductor disposed between the first gate electrode and the second gate electrode.

8. The display apparatus of claim 7, wherein the first gate electrode and the second gate electrode of the third transistor are electrically connected each other through a contact hole.

9. The display apparatus of claim 1, further comprising a shield line disposed between the data line and a node connection line electrically connecting the driving transistor and the second transistor in a plan view.

10. The display apparatus of claim 9, wherein the second gate electrode of the second transistor and the shield line comprise a same material.

11. The display apparatus of claim 9, wherein the shield line receives a constant voltage.

12. The display apparatus of claim 9, wherein the shield line extends in an extension direction of the data line.

13. The display apparatus of claim 1, further comprising:
   a driving voltage line extending in a first direction;
   a node connection line electrically connecting the driving transistor and the second transistor and extending in the first direction; and
   a shield line electrically connected to the driving voltage line and located between the data line and the node connection line in a plan view.

14. The display apparatus of claim 1, further comprising:
   a light emitting diode;
   a third transistor connected between the gate electrode of the driving transistor and a second voltage line;
   a fifth transistor connected between the driving transistor and the light emitting diode; and
   a sixth transistor connected between the light emitting diode and the second voltage line.

15. The display apparatus of claim 1, wherein the silicon semiconductor of the driving transistor has a bent portion.

* * * * *